(12) United States Patent
Patel et al.

(10) Patent No.: US 10,935,885 B1
(45) Date of Patent: Mar. 2, 2021

(54) SYSTEM AND METHOD FOR CLEANING MESA SIDEWALLS

(71) Applicant: CANON KABUSHIKI KAISHA, Tokyo (JP)

(72) Inventors: Mehul N. Patel, Austin, TX (US); Edward Brian Fletcher, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/787,626

(22) Filed: Feb. 11, 2020

(51) Int. Cl.
*G03F 7/00* (2006.01)

(52) U.S. Cl.
CPC .................. *G03F 7/0002* (2013.01)

(58) Field of Classification Search
CPC ............. G03F 7/70925; G03F 7/0002
See application file for complete search history.

(56) References Cited

U.S. PATENT DOCUMENTS

| | | | |
|---|---|---|---|
| 8,226,392 B2 | 7/2012 | Kawakami | |
| 2006/0150849 A1 | 7/2006 | Van Santen | |
| 2011/0188011 A1* | 8/2011 | Ehm | G03F 7/70925 355/30 |
| 2013/0224322 A1* | 8/2013 | Shizawa | B81C 99/009 425/155 |
| 2013/0320589 A1 | 12/2013 | Fujita | |
| 2017/0120572 A1 | 5/2017 | Khusnatdinov | |
| 2018/0275510 A1* | 9/2018 | Kawamura | G03F 7/0002 |
| 2019/0101823 A1 | 4/2019 | Patel | |
| 2019/0263031 A1 | 8/2019 | Murasato | |
| 2019/0377257 A1 | 12/2019 | Fletcher | |
| 2020/0026183 A1 | 1/2020 | Fletcher | |

FOREIGN PATENT DOCUMENTS

JP    2012-039057 A    2/2012

* cited by examiner

*Primary Examiner* — Steven Whitesell Gordon
(74) *Attorney, Agent, or Firm* — Canon U.S.A., Inc. IP Division

(57) ABSTRACT

Devices, systems, and methods position a template for imprinting a formable material over one or more gas-flow channels on a stage, wherein the template includes a patterning surface, a mesa, and at least one mesa sidewall; and direct a gas flow through the one or more gas-flow channels toward a portion of the at least one mesa sidewall.

21 Claims, 20 Drawing Sheets

SYSTEM AND METHOD FOR CLEANING MESA SIDEWALLS

BACKGROUND

Technical Field

This application generally concerns cleaning mesa sidewalls of templates that are used for nano-fabrication (e.g., imprint lithography).

Background

Nano-fabrication includes the fabrication of very small structures that have features on the order of 100 nanometers or smaller. One application of nano-fabrication is the fabrication of integrated circuits. The semiconductor-processing industry continues to strive for larger production yields while increasing the circuits per unit area formed on a substrate. Improvements in nano-fabrication include providing greater process control and improving throughput while also allowing continued reduction of the minimum feature dimensions of the structures formed.

One nano-fabrication technique is commonly referred to as nanoimprint lithography. Nanoimprint lithography is useful in a variety of applications including, for example, fabricating one or more layers of integrated devices. Examples of an integrated device include CMOS logic, microprocessors, NAND Flash memory, NOR Flash memory, DRAM memory, MRAM, 3D cross-point memory, Re-RAM, Fe-RAM, STT-RAM, MEMS, and the like. Examples of nanoimprint lithography systems and processes are described in detail in numerous publications, such as U.S. Pat. Nos. 8,349,241, 8,066,930, and 6,936,194.

The nanoimprint lithography technique disclosed in each of the aforementioned patents describes the formation of a relief pattern in a formable material (polymerizable) layer and transferring a pattern corresponding to the relief pattern into or onto an underlying substrate. The patterning process uses a template spaced apart from the substrate, and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device (article) fabrication, including, for example, curing, oxidation, layer formation, deposition, doping, planarization, etching, formable material removal, dicing, bonding, packaging, and the like.

Prior to imprinting, a patterning surface of the template may be pretreated with one or more materials using one or more pre-treatment processes, and the patterning surface may also be sprayed with a surfactant. The patterning surface is on a mesa of the template, and the mesa is surrounded by a recessed surface. Sidewalls connect the recessed surface to the mesa. During the imprinting process, formable liquid sometimes extrudes out from the imprint field and attaches to the sidewalls, thereby forming extrusions.

SUMMARY

Some embodiments of a method comprise positioning a template for imprinting a formable material over one or more nozzles on a stage, wherein the template includes a patterning surface, a mesa, and at least one mesa sidewall; and directing a gas flow through the one or more nozzles toward a portion of the at least one more mesa sidewall.

Some embodiments of a device comprise a template chuck configured to hold a template for imprinting a formable material, wherein the template includes a patterning surface, a mesa, and a mesa sidewall; and a stage that is movable relative to the template, wherein the stage includes a substrate chuck and one or more gas-flow channels that are configured to direct a gas flow at the mesa sidewall.

DESCRIPTION

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments.

Also, as used herein, the conjunction "or" generally refers to an inclusive "or," though "or" may refer to an exclusive "or" if expressly indicated or if the context indicates that the "or" must be an exclusive "or."

Figure 1:
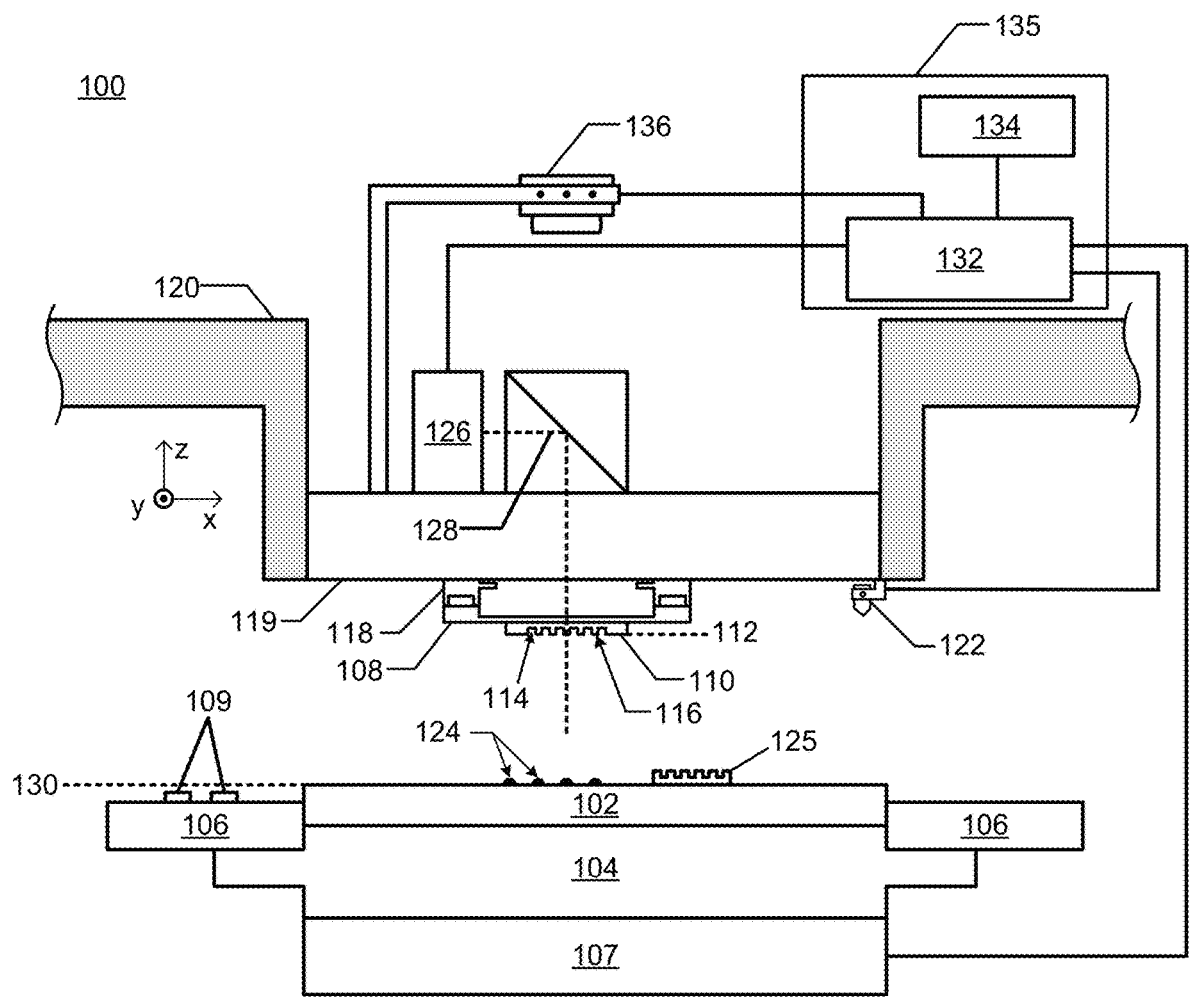
FIG. 1 illustrates an example embodiment of a nanoimprint lithography system.

FIG. 1 illustrates an example embodiment of a nanoimprint lithography system 100. When operating, the nanoimprint lithography system 100 deposits formable material 124 (e.g., resist) on a substrate 102 (e.g., a wafer) and forms a patterned layer 125, which has a relief pattern, in the formable material 124 in an imprint field on the substrate 102 by using a template 108 that has a mesa (also referred to as a mold) 110 that has a patterning surface 112 to imprint the formable material 124 on the substrate 102.

Figure 2:
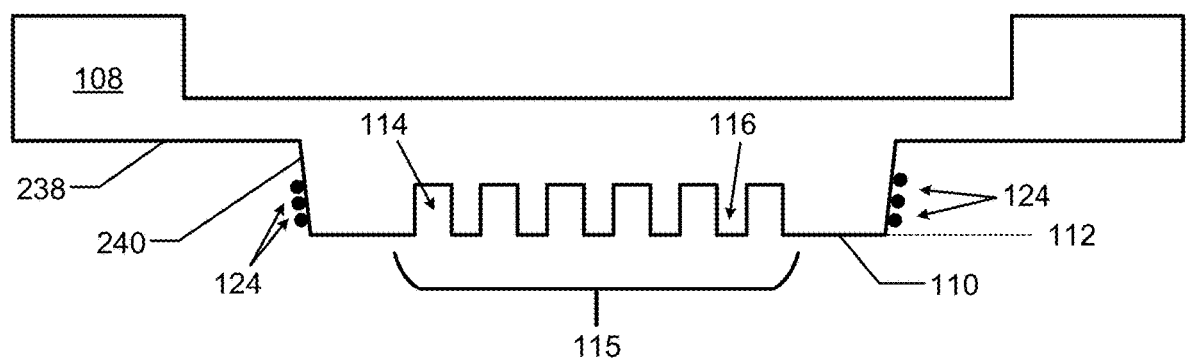
FIG. 2 illustrates an example embodiment of a mesa that has mesa sidewalls on which formable material has accumulated.

A single mesa 110 may be used to imprint formable material 124 in a plurality of imprint fields on a single substrate 102 or a plurality of substrates 102. While imprinting formable material 124 in a plurality of imprint fields, formable material 124 may accumulate on the sidewalls of the mesa 110, for example via one or both of seepage and vapor deposition (formable material 124 that evaporates and deposits on a surface). For example, FIG. 2 illustrates an example embodiment of a template 108 that includes a mesa 110 that has mesa sidewalls 240 on which formable material 124 has accumulated. As the number of imprints that are performed by the mesa 110 increases, the buildup of formable material 124 on the mesa sidewall 240 may reach a point at which the buildup of formable material 124 begins to create defects in the patterned layer 125 in the imprint fields. For example, extrusions may begin to form, and extrusions can cause a variety of imprint and post-imprint defects.

The nanoimprint lithography system 100 also includes one or more gas-flow channels 109 (e.g., nozzles, vents, openings). The gas-flow channels 109 emit (e.g., direct, blow, expel) respective flows of gas that flow over the sidewalls 240 of the mesa 110, which removes some of the buildup of formable material 124 on the mesa sidewalls 240. Examples of such gases include CDA (clean dry air and/or compressed dry air), N2, and He. In some embodiments, the gas emitted from the gas-flow channels 109 is better than or meets semiconductor cleanliness standards of the environment in which the nanoimprint lithography system 100 is operated. Furthermore, to configure the emitted gas flow, the respective shape of each gas-flow channel 109 may be selected according to one or more of the following: flow rate, flow speed, flow shape, flow pressure, flow direction, and flow mass. The nanoimprint lithography system 100 may also include a heater that heats the gas to increase the rate at which the formable material 124 evaporates from the mesa sidewall. And the nanoimprint lithography system 100 may include one or more fans (e.g., blowers), may include one or more gas-supply lines, may include one or more valves, and may adjust the flow rate of the gas for different applications. The nanoimprint lithography system 100 may be connected to one or more gas supplies and may include one or more mass flow controllers, which adjust the amount, rate, timing, and/or mixture of the gas supplied to the gas-flow channels 109.

In the embodiment shown in FIG. 1, the gas-flow channels 109 are attached to or integrated into an applique 106. However, in some embodiments, the gas-flow channels 109 are attached to or integrated into other members of the nanoimprint lithography system 100, such as a substrate positioning stage 107. And, in some embodiments, the gas-flow channels 109 are not integrated with and not attached to any other members of the nanoimprint lithography system 100. In some embodiments, a top surface of the applique 106 is at or near a top surface of either or both of a substrate chuck 104 and a substrate surface 130 and the gas-flow channels 109 are nozzles that do not extend above a top surface of the applique 106. And, in some embodiments, the gas-flow channels 109 include holes in the applique 106 that guide the emitted gas towards specific portions of the template (such as the mesa sidewalls 240 or the patterning surface 112) at specific times.

Furthermore, some embodiments include one or more gas-flow channels 109 or gas-flow-channel assemblies that are attached to one or more actuators that raise and lower the gas-flow channels 109. For example, some of these embodiments (i) lower the gas-flow channels 109 to a safe distance from the template 108 before the system 100 moves the substrate 102 and the applique 106 relative to the template 108 and (ii) raise the gas-flow channels 109 to a gas-flow height before activating their respective gas flows. Examples of the gas-flow height include the height of the substrate surface 130 and include a percentage of the gap between the substrate 102 and either of the patterning surface 112 and a fluid dispenser 122.

The applique 106 may be configured to stabilize the local gas environment beneath the template 108 and/or help protect the patterning surface 112 from particles, for example when the template is not above the substrate surface 130.

Also, the applique 106 is supported by the substrate chuck 104. In some embodiments, such as the embodiment shown in FIG. 1, the applique 106 is mounted on the substrate chuck 104 without any part of the applique being sandwiched between the substrate chuck 104 and the substrate 102. Additionally, in some embodiments, the applique 106 surrounds a perimeter of the substrate 102. Furthermore, an upper surface of the applique 106 may be below (e.g., as shown in FIG. 1) or coplanar with (e.g., as shown in FIG. 8C) the substrate surface 130.

In the nanoimprint lithography system 100 in FIG. 1, the substrate 102 is coupled to the substrate chuck 104.

Examples of substrate chucks 104 include the following: vacuum chucks, pin-type chucks, groove-type chucks, electrostatic chucks, and electromagnetic chucks. The substrate chuck 104 is supported by the substrate positioning stage 107. And the applique 106 and/or the substrate positioning stage 107 may include at least some of the one or more gas-flow channels 109.

The substrate positioning stage 107 may provide translational or rotational motion along one or more of the x, y, z, θ, and φ-axes. The substrate positioning stage 107, the substrate 102, and the substrate chuck 104 may also be positioned on a base (not shown). Additionally, the substrate positioning stage 107 may be a part of a positioning system or a positioning subsystem.

The nanoimprint lithography system 100 also includes a template 108. The template 108 may include a body that includes the mesa 110 (also referred to as a mold), which extends toward the substrate 102 along the z axis. The mesa 110 may have a patterning surface 112 thereon. Also, the template 108 may be formed without the mesa 110. Thus, in some embodiments, the surface of the template 108 that faces the substrate 102 functions as the mesa 110, and the patterning surface 112 is included on the surface of the template 108 that faces the substrate 102. Examples of materials that may constitute the template 108 or the mesa 110 include the following: fused-silica, quartz, silicon, organic polymers, siloxane polymers, borosilicate glass, fluorocarbon polymers, metal, and hardened sapphire.

The patterning surface 112 has features that are defined by a plurality of spaced-apart template recesses 114 or template protrusions 116, though some embodiments include other configurations (e.g., a planar surface). The patterning surface 112 defines a pattern that forms the basis (e.g., an inverse) of the relief pattern of the patterned layer 125, which is formed from formable material 124 on the substrate 102. In some embodiments, the patterning surface 112 is featureless, in which case a planar surface is formed from formable material 124 on the substrate 102.

The template 108 may be coupled to a template chuck 118. Examples of template chucks 118 include the following: vacuum chucks, pin-type chucks, groove-type chucks, electrostatic chucks, and electromagnetic chucks. The template chuck 118 may be configured to apply a force to the template 108 that varies across the template 108. The template chuck 118 may be coupled to an imprint head 119, which in turn may be moveably coupled to a bridge 120 such that the template chuck 118, the imprint head 119, and the template 108 are moveable in at least the z-axis direction. In some embodiments, the template chuck 118, the imprint head 119, and the template 108 are also movable in one or more of the x, y, θ, and φ-axes directions. The nanoimprint lithography system 100 may include one or more motors that move the template 108.

The nanoimprint lithography system 100 also includes a fluid dispenser 122. The fluid dispenser 122 may also be moveably coupled to the bridge 120. In some embodiments, the fluid dispenser 122 and the template chuck 118 share one or more positioning components. And in some embodiments, the fluid dispenser 122 and the template chuck 118 move independently of each other.

When operating, the fluid dispenser 122 deposits liquid formable material 124 onto the substrate 102, for example in a pattern (e.g., a drop pattern). Also for example, the formable material 124 may be a resist (e.g., photo resist) or another polymerizable material, and the formable material 124 may comprise a mixture that includes a monomer.

The formable material 124 may be dispensed upon the substrate 102 before or after a desired volume is defined between the patterning surface 112 and the substrate 102, depending on design considerations. Different fluid dispensers 122 may use different technologies to dispense the formable material 124. When the formable material 124 is jettable, ink-jet-type fluid dispensers 122 may be used to dispense the formable material 124. For example, thermal ink jetting, microelectromechanical-systems-based (MEMS-based) ink jetting, and piezoelectric ink jetting are technologies for dispensing jettable liquids.

Furthermore, additional formable material 124 may be added to the substrate 102 using various techniques, for example drop dispense, spin-coating, dip coating, chemical vapor deposition (CVD), physical vapor deposition (PVD), thin film deposition, thick film deposition, or the like.

The nanoimprint lithography system 100 also includes an energy source 126 that directs actinic energy along an exposure path 128. The imprint head 119 and the substrate positioning stage 107 may be configured to position the template 108 and the substrate 102 on (e.g., in superimposition with) the exposure path 128. A camera 136 may likewise be positioned such that an imaging field of the camera 136 is in superimposition with at least part of the exposure path 128.

Once the formable material 124 has been deposited on the substrate, either the imprint head 119, the substrate positioning stage 107, or both varies a distance between the mesa 110 and the substrate 102 to define a desired volume that is filled by the formable material 124. For example, the imprint head 119 may apply a force to the template 108 that moves the mesa 110 into contact with the formable material 124 that is on the substrate 102. After the desired volume is filled with the formable material 124, the energy source 126 produces energy (e.g., actinic radiation (UV)) that is directed along the exposure path 128 to the formable material 124 and that causes the formable material 124 to cure, solidify, or cross-link in conformance to a shape of the substrate surface 130 and the patterning surface 112, thereby defining a patterned layer 125 on the substrate 102. The formable material 124 is cured while the template 108 is in contact with formable material 124 forming the patterned layer 125 on the substrate 102. Thus, the nanoimprint lithography system 100 uses an imprinting process to form the patterned layer 125, which has recesses and protrusions that are an inverse of the pattern in the patterning surface 112.

The imprinting process may be done repeatedly in a plurality of imprint fields that are spread across the substrate surface 130. For example, each of the imprint fields may be the same size as the mesa 110 or the same size as only the pattern area 115 of the mesa 110. The pattern area 115 of the mesa 110 is a region of the patterning surface 112 that is used to imprint patterns on a substrate 102 (e.g., a region that includes the template recesses 114 and the template protrusions 116). The pattern area 115 of the mesa 110 may include fluid control features that are used to prevent extrusions. In some embodiments, the substrate 102 has only one imprint field, and the imprint field is the same size as the substrate 102 or as the area of the substrate 102 which is to be patterned with the mesa 110. Also, in some embodiments, the imprint fields overlap. Some of the imprint fields may be partial imprint fields which intersect with a boundary of the substrate 102.

The patterned layer 125 may be formed such that it has a residual layer that has a residual layer thickness (RLT) above a highest point on the substrate surface 130 in each imprint field. The patterned layer 125 may also include one or more features, such as protrusions, that extend above the residual layer. These protrusions match the recesses 114 in the patterning surface 112 of the mesa 110.

The patterned layer 125 can be further subjected to known steps and processes for article (e.g., device) fabrication, including, for example, curing, oxidation, layer formation, deposition, doping, planarization, etching, formable material removal, dicing, bonding, packaging, and the like. Examples of articles include CMOS logic, microprocessors, NAND Flash memory, NOR Flash memory, DRAM memory, MRAM, 3D cross-point memory, Re-RAM, Fe-RAM, STT-RAM, and MEMS.

The nanoimprint lithography system 100 may be regulated, controlled, or directed by one or more processors 132 (e.g., controllers) in communication with one or more other components or subsystems, such as the substrate positioning stage 107, the imprint head 119, the fluid dispenser 122, the energy source 126, or the camera 136, and may operate based on instructions in a computer-readable program stored in one or more non-transitory computer-readable media 134. In some embodiments, including the embodiment in FIG. 1, the one or more processors and the one or more non-transitory computer-readable media 134 are included in a nanoimprint-lithography-control device 135. The nanoimprint-lithography-control device 135 regulates, controls, or directs the operations of the nanoimprint lithography system 100.

Each of the one or more processors 132 may be or may include one or more of the following: a central processing units (CPU), which may include microprocessors (e.g., a single core microprocessor, a multi-core microprocessor); a graphics processing unit (GPUs); an application-specific integrated circuit (ASIC); a field-programmable-gate array (FPGA); a digital signal processors (DSP); a specially-configured computer; and other electronic circuitry (e.g., other integrated circuits). For example, a processor 132 may be a purpose-built controller or may be a general-purpose computing device that has been specially-configured to be a nanoimprint-lithography-system controller.

Examples of non-transitory computer-readable media include, but are not limited to, a magnetic disk (e.g., a floppy disk, a hard disk), an optical disc (e.g., a CD, a DVD, a Blu-ray), a magneto-optical disk, magnetic tape, semiconductor memory (e.g., a non-volatile memory card, flash memory, a solid-state drive, SRAM, DRAM, EPROM, EEPROM), a networked attached storage (NAS), an intranet-connected non-transitory computer-readable storage device, and an internet-connected non-transitory computer-readable storage device.

As noted above, FIG. 2 illustrates an example embodiment of a template 108 that includes a mesa 110 that has mesa sidewalls 240 on which formable material 124 has accumulated. The mesa 100 includes a patterning surface 112, and the mesa 110 is surrounded by a recessed surface 238. The mesa sidewalls 240 connect the recessed surface 238 to the patterning surface 112 of the mesa 110. The mesa sidewalls 240 surround the mesa 110. In embodiments in which the mesa 110 is round or has rounded corners, the mesa sidewalls 240 refers to a single mesa sidewall that is a continuous wall that has rounded corners or that has no corners. The template 108 also may include a patterning-surface coating on the patterning surface 112. The patterning-surface coating may be a monolayer of a release agent that is constantly replenished during the imprinting process.

Figure 3:
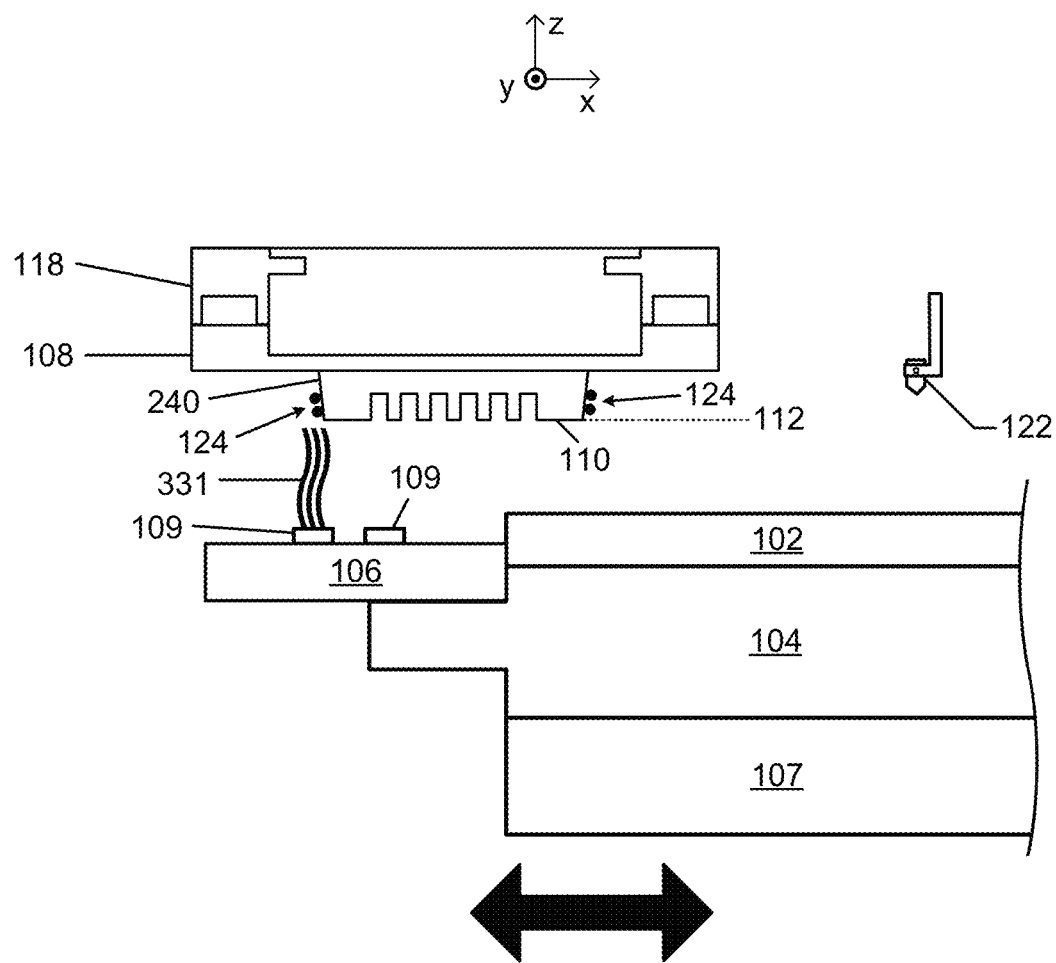
FIG. 3 illustrates an example embodiment of a gas-flow channel directing a flow of gas over a sidewall of a mesa.
Figure 10A:
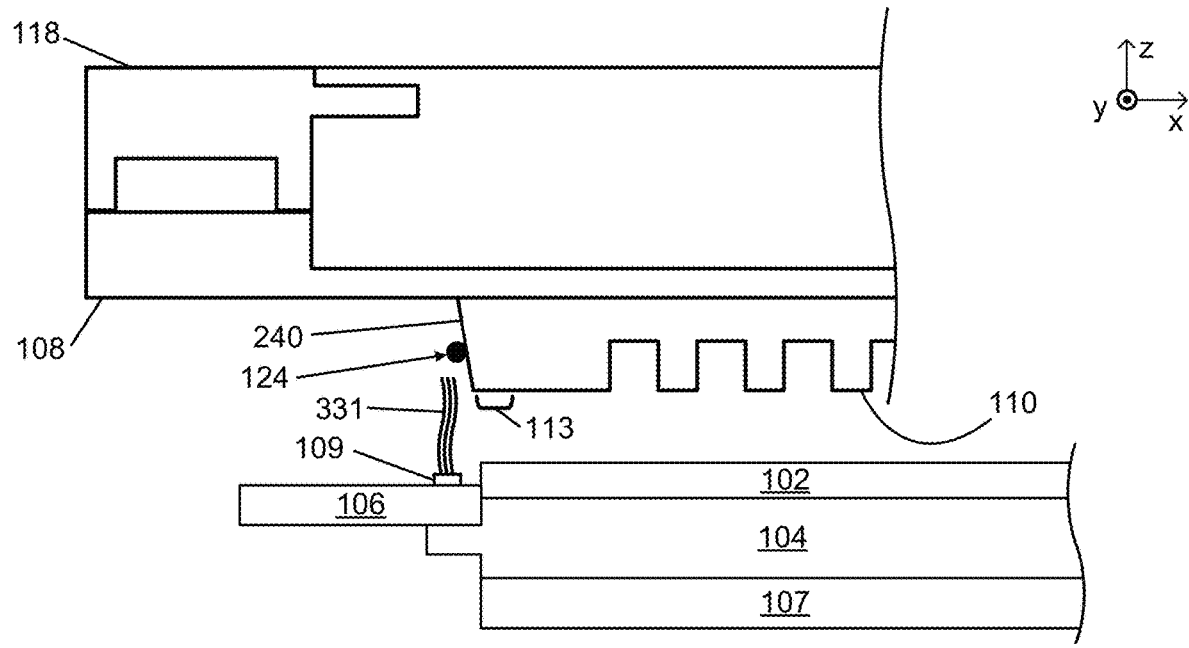
FIG. 10A illustrates an example embodiment of a gas-flow channel directing a flow of gas toward a sidewall of a mesa.
Figure 10B:
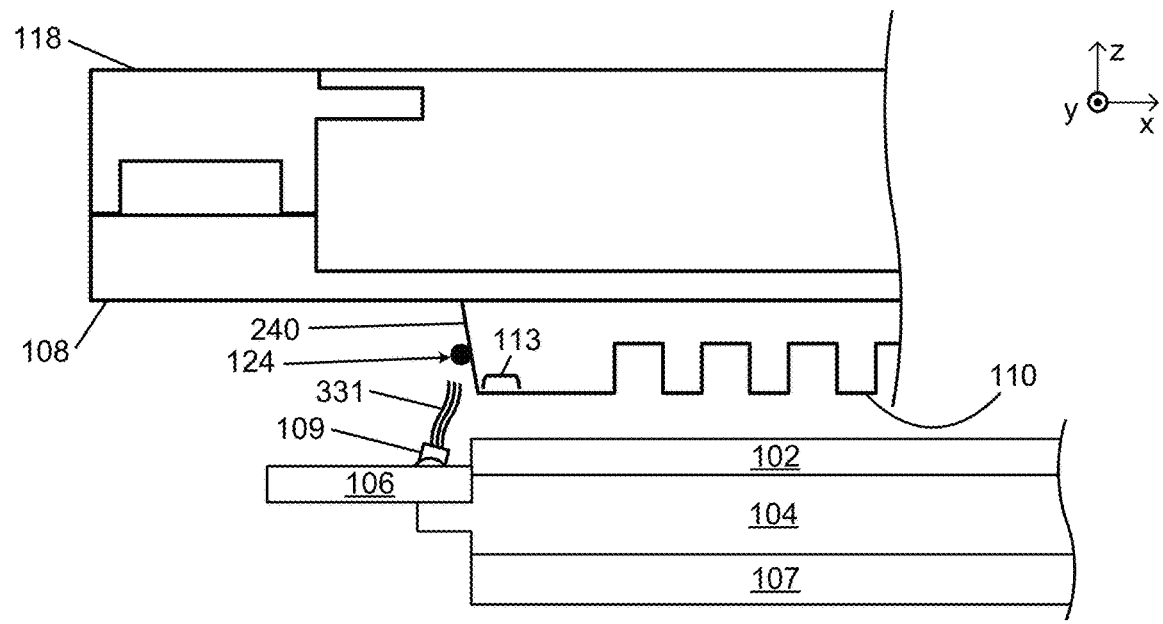
FIG. 10B illustrates an example embodiment of a gas-flow channel directing a flow of gas toward a sidewall of a mesa.

FIG. 3 illustrates an example embodiment of a gas-flow channel 109 directing (e.g., directing) a flow of gas 331 over a sidewall 240 of the mesa 110. As the substrate positioning stage 107 moves the substrate 102, the substrate chuck 104, and the applique 106 between a position under the template 108 and a position under the fluid dispenser 122, the nanoimprint lithography system 100 (e.g., under the control of the one or more processors 132 operating based on instructions stored in one or more non-transitory computer readable media 134) causes the gas-flow channel 109 that is below the mesa sidewall 240 to direct a flow of gas 331 (gas flow 331) toward the mesa sidewall 240. In this embodiment, the nanoimprint lithography system 100 does not activate the gas-flow channel 109 that is not within a threshold distance, on the x axis (or the y axis), of the mesa sidewall 240. Thus, some embodiments of the nanoimprint lithography system 100 direct no gas flow or substantially no gas flow over the patterning surface 112. As used herein, substantially none of a gas flow 331 is directed toward a patterning surface 112 when, as the gas flow 331 leaves a gas-flow channel 109, all of the gas flow 331 is traveling toward a mesa sidewall 240 or toward an outer border region of the patterning surface 112 of the mesa 110 (e.g., as shown in FIGS. 10A and 10B), for example a border that includes the parts of the patterning surface 112 that are within 0.5 mm of a mesa sidewall 240.

Also, while the embodiment in FIG. 3 and the following example embodiments direct a flow of gas 331 toward a mesa sidewall 240, other embodiments may expel, blow, or otherwise emit a flow of gas 331 toward a mesa sidewall 240.

FIGS. 4A-D illustrate an example embodiment of gas-flow channels 109 directing flows of gas 331 toward the sidewalls 240 of a mesa 110 over a period of time. During the period of time (from time=1 to time=4), the substrate 102, the substrate chuck 104, the applique 106, and the gas-flow channels 109 move relative to the template 108 along the x axis (for example, according to a movement of the substrate positioning stage 107).

Figure 4A:
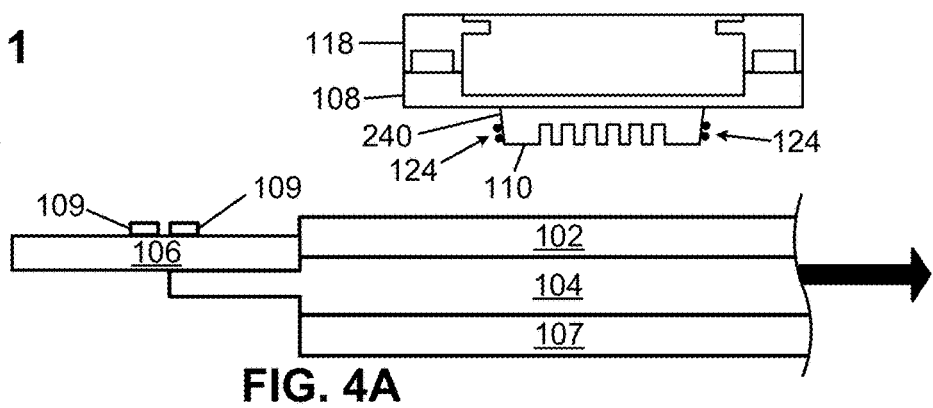
FIGS. 4A-D illustrate an example embodiment of gas-flow channels directing flows of gas toward the sidewalls of a mesa over a period of time.

In FIG. 4A, at time=1, none of the mesa sidewalls 240 have moved within a threshold distance, on the x axis, of the gas-flow channels 109. Accordingly, the nanoimprint lithography system 100 has not caused the gas-flow channels 109 to direct respective flows of gas toward any of the mesa sidewall 240.

Figure 4B:
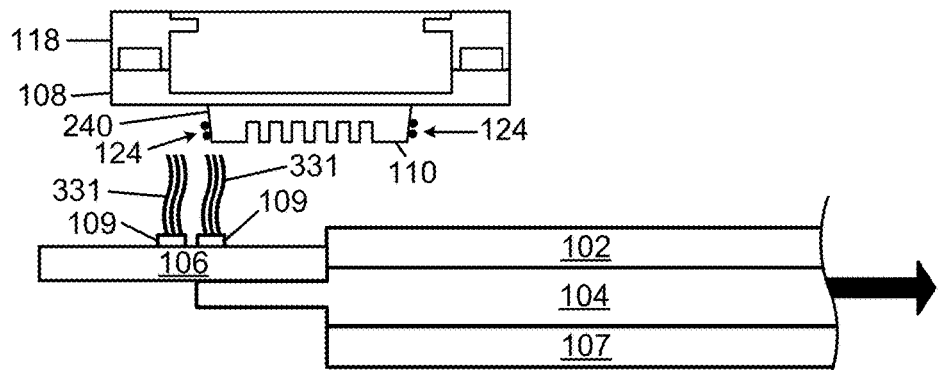

In FIG. 4B, at time=2, a mesa sidewall 240 has moved within the threshold distance, on the x axis, of the gas-flow channels 109. Accordingly, the nanoimprint lithography system 100 has caused the gas-flow channels 109 to direct respective flows of gas 331 toward the mesa sidewall 240.

Figure 4C:
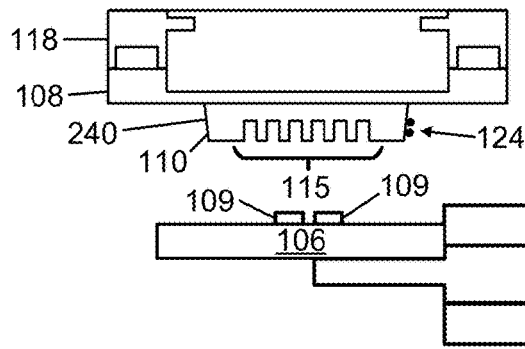

In FIG. 4C, at time=3, along the x axis the pattern area 115 of the mesa 110 is over the gas-flow channels 109, and the nanoimprint lithography system 100 has stopped the flows of gas from the gas-flow channels 109.

Figure 4D:
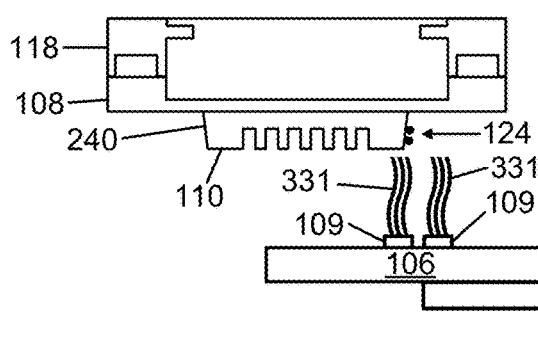

In FIG. 4D, at time=4, another mesa sidewall 240 has moved within the threshold distance, on the x axis, of the gas-flow channels 109. Accordingly, the nanoimprint lithography system 100 has caused the gas-flow channels 109 to direct respective flows of gas 331 toward the other mesa sidewall 240. Once the other mesa sidewall 240 has moved outside of the threshold distance, the nanoimprint lithography system 100 stops the flows of gas 331 from the gas-flow channels 109.

Figure 5A:
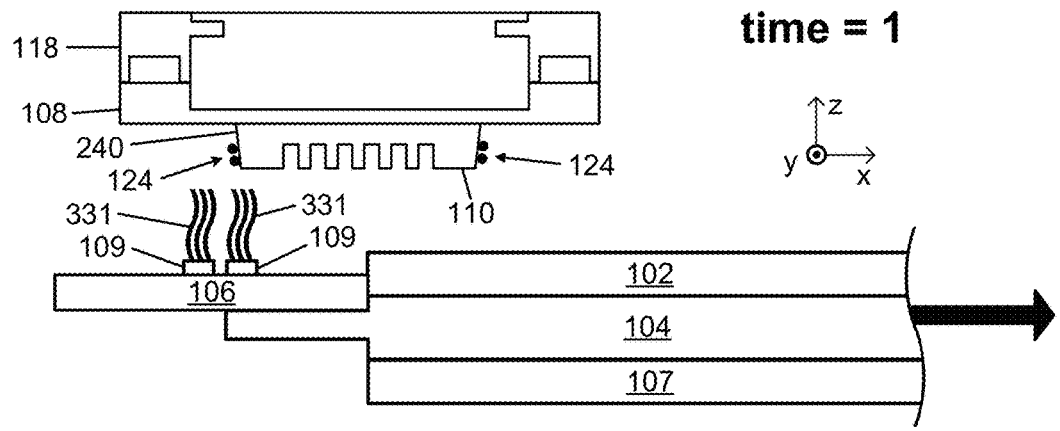
FIGS. 5A-C illustrate an example embodiment of gas-flow channels directing flows of gas toward the sidewalls of a mesa over a period of time.
Figure 5B:
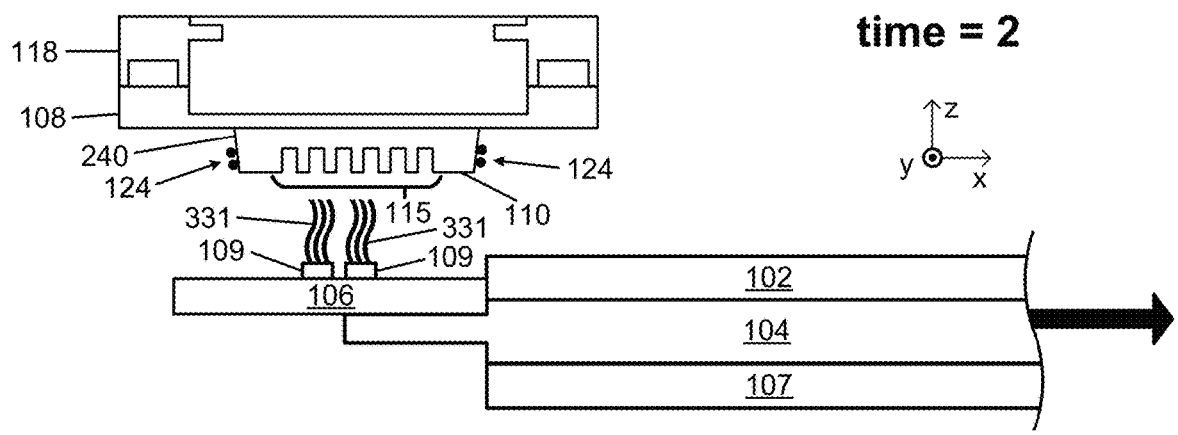
Figure 5C:
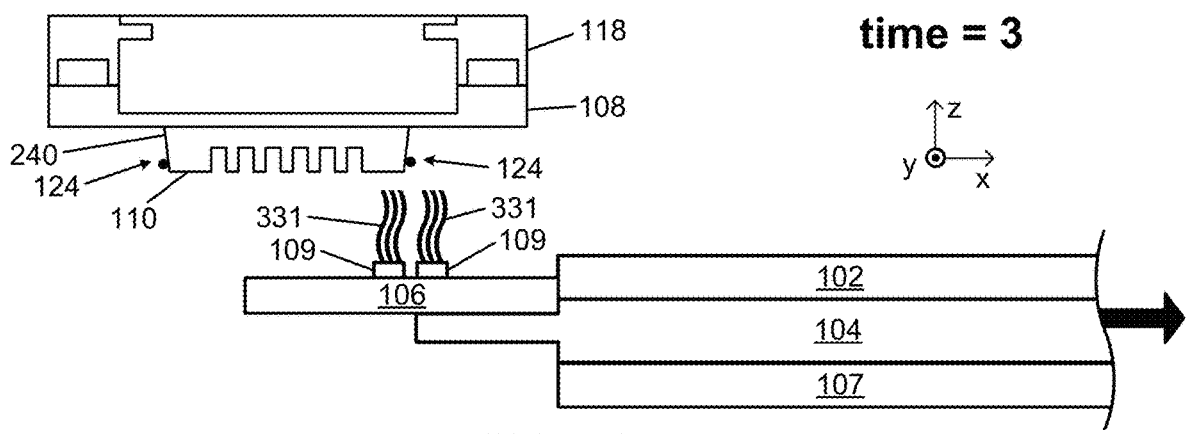

FIGS. 5A-C illustrate an example embodiment of gas-flow channels 109 directing flows of gas 331 toward the sidewalls 240 of a mesa 110 over a period of time. During the period of time (from time=1 to time=3), the substrate 102, the substrate chuck 104, the applique 106, and the gas-flow channels 109 move relative to the template 108 along the x axis (for example, according to a movement of the substrate positioning stage 107).

In FIG. 5A, at time=1, a mesa sidewall 240 has moved within the threshold distance, on the x axis, of the gas-flow channels 109. Accordingly, the nanoimprint lithography system 100 has caused the gas-flow channels 109 to direct respective flows of gas 331 toward the mesa sidewall 240.

In FIG. 5B, at time=2, on the x axis the pattern area 115 of the mesa 110 is over the gas-flow channels 109. However, in this embodiment, the nanoimprint lithography system 100 continues the flows of gas 331 from the gas-flow channels 109.

In FIG. 5C, at time=3, another mesa sidewall 240 has moved within the threshold distance, on the x axis, of the gas-flow channels 109. Accordingly, the nanoimprint lithography system 100 continues the flows of gas 331 from the gas-flow channels 109. Once the other mesa sidewall 240 has moved outside of the threshold distance, the nanoimprint lithography system 100 stops the flows of gas 331 from the gas-flow channels 109.

Figure 6A:
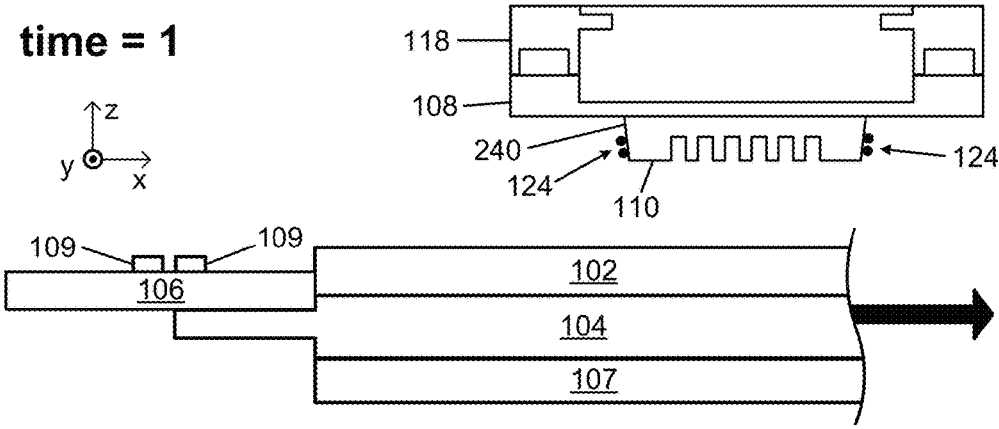
FIGS. 6A-C illustrate an example embodiment of gas-flow channels directing flows of gas toward the sidewalls of a mesa over a period of time.
Figure 6B:
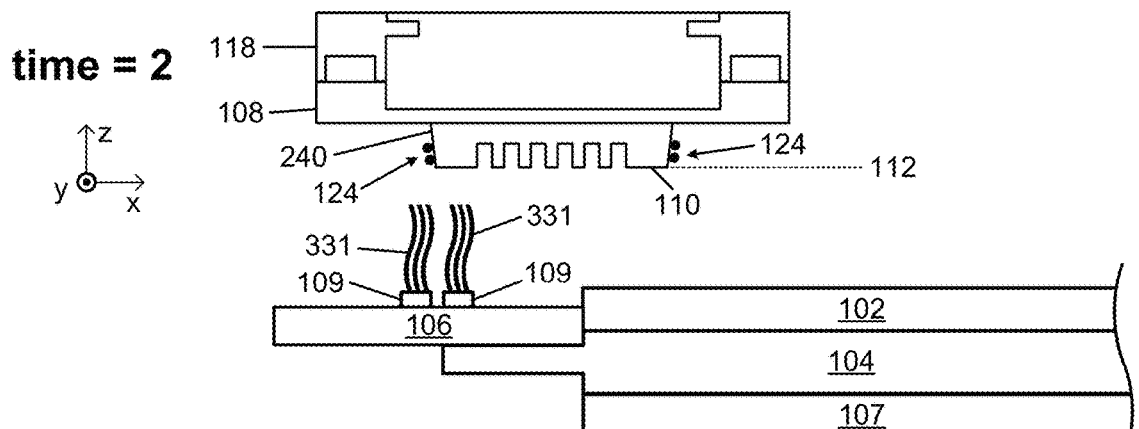
Figure 6C:
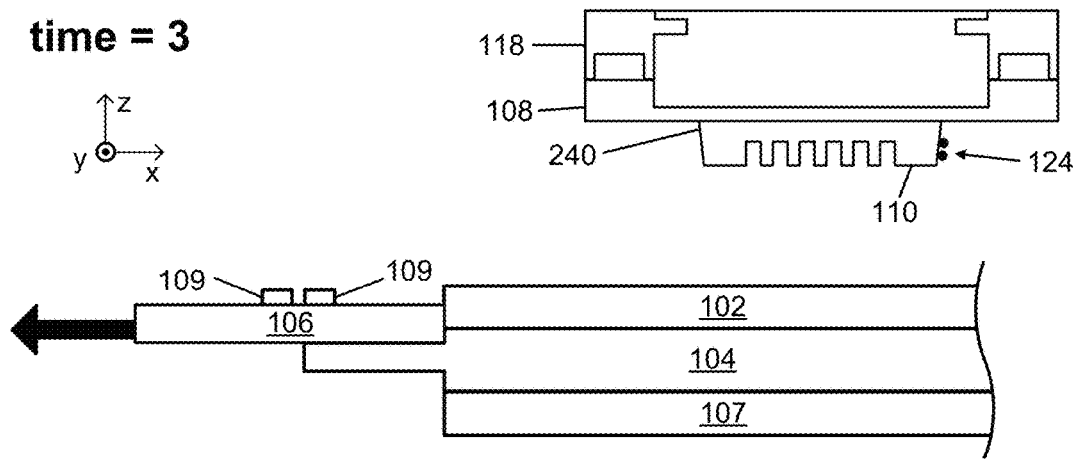

FIGS. 6A-C illustrate an example embodiment of gas-flow channels directing flows of gas toward the sidewalls of a mesa over a period of time. In FIG. 6A, at time=1, the substrate 102, the substrate chuck 104, the applique 106, and the gas-flow channels 109 are moving relative to the template 108 along the x axis (for example, according to a movement of the substrate positioning stage 107).

In FIG. 6B, at time=2, the gas-flow channels 109 are stationary relative to the mesa 110. Also, a mesa sidewall 240 is within a threshold distance of the gas-flow channels 109. In this embodiment, while the gas-flow channels 109 are stationary relative to the mesa 110, the nanoimprint lithography system 100 causes the gas-flow channels 109 to direct respective flows of gas 331 toward the mesa sidewall 240. Also, for example, the gas-flow channels 109 may be stationary relative to the mesa 110 when a substrate 102 is being removed from the substrate chuck 104, when a new substrate 102 is being placed on the substrate chuck 104, when the fluid dispenser 122 is above a new area 141 to dispense formable material 124 prior to imprinting, or when the fluid dispenser 122 is depositing (e.g., jetting) formable material 124 onto the substrate 102. And, in some embodiments, the gas-flow channels 109 have different respective gas-flow rates. For example, the gas-flow channel 109 in FIG. 7 that is farthest from the patterning surface 112 of the mesa 110 may have a higher gas-flow rate than the gas-flow channel that is closest to the patterning surface 112 of the mesa 110.

In FIG. 6C, at time=3, the gas-flow channels 109 are moving away from the mesa 110, and the nanoimprint lithography system 100 has stopped the gas flows from the gas-flow channels 109.

Figure 7A:
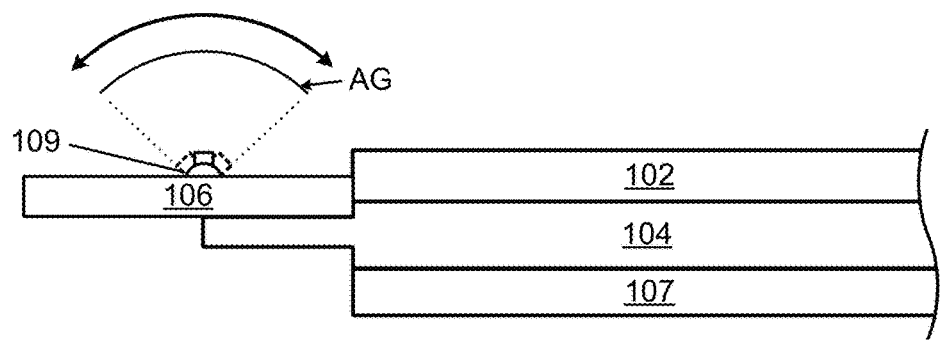
FIG. 7A illustrates an example embodiment of an adjustable gas-flow channel on an applique.

FIG. 7A illustrates an example embodiment of an adjustable gas-flow channel 109 on an applique 106. In this embodiment, the gas-emission angle of the gas-flow channel 109 relative to the surface of the applique 106 is adjustable. In some embodiments, the gas-emission angle of the gas-flow channel 109 can be adjusted by the nanoimprint lithography system 100, for example by activating one or more motors (e.g., servomotors) or one or more actuators. This embodiment shows the range within which the gas-emission angle AG of the gas-flow channel 109 can be adjusted. And the direction of the emitted gas flow can be changed by changing the gas-emission angle of the gas-flow channel 109.

Figure 7B:
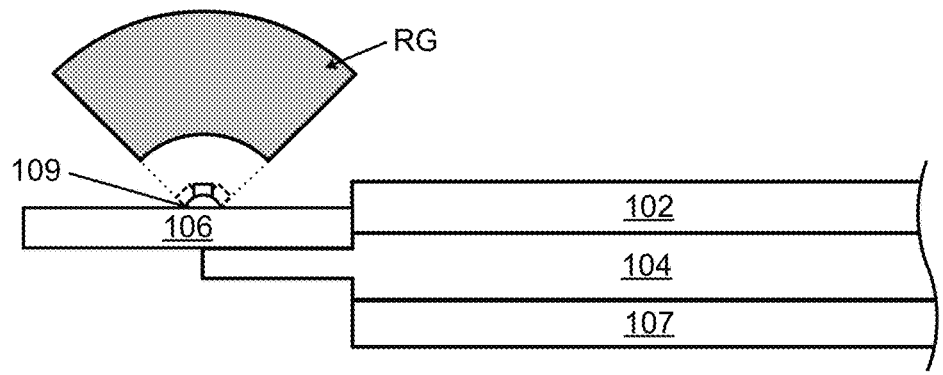
FIG. 7B illustrates an example embodiment of adjustable gas-flow channels on an applique.

FIG. 7B illustrates an example embodiment of an adjustable gas-flow channel 109 on an applique 106. Similar to FIG. 7A, the gas-emission angle of the gas-flow channel 109 relative to the surface of the applique 106 is adjustable. However, this embodiment shows the gas-flow range RG within which the nanoimprint lithography system 100 may determine that a mesa sidewall is within the gas-flow range of the gas-flow channel 109. The gas-flow range may be determined based on various parameters, including, for example, the rate of the gas flow, the speed of the gas flow, the pressure of the gas flow, the shape of the gas flow, the mass of the gas flow, the heat of the gas, the contents of the gas (e.g., the elements that compose the gas), the contents of the formable material, and the materials that compose the mesa sidewalls.

Figure 7C:
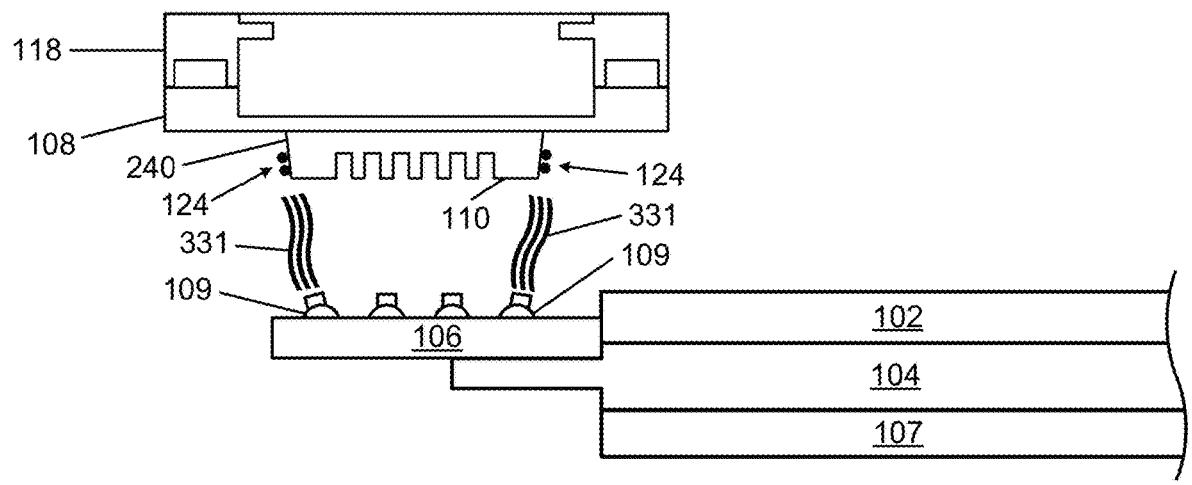
FIG. 7C illustrates an example embodiment of adjustable gas-flow channels on an applique.

FIG. 7C illustrates an example embodiment of adjustable gas-flow channels 109 on an applique 106. In this embodiment, relative to an angle that is normal to the surface of the applique 106, the gas-emission angles of two of the gas-flow channels 109 have been adjusted to further direct their respective gas flows 331 toward the mesa sidewalls 240. The nanoimprint lithography system 100 can adjust the gas-emission angles of the gas-flow channels 109 based on the positions of the gas-flow channels 109 relative to the mesa sidewalls 240, for example using one or more motors.

Figure 8A:
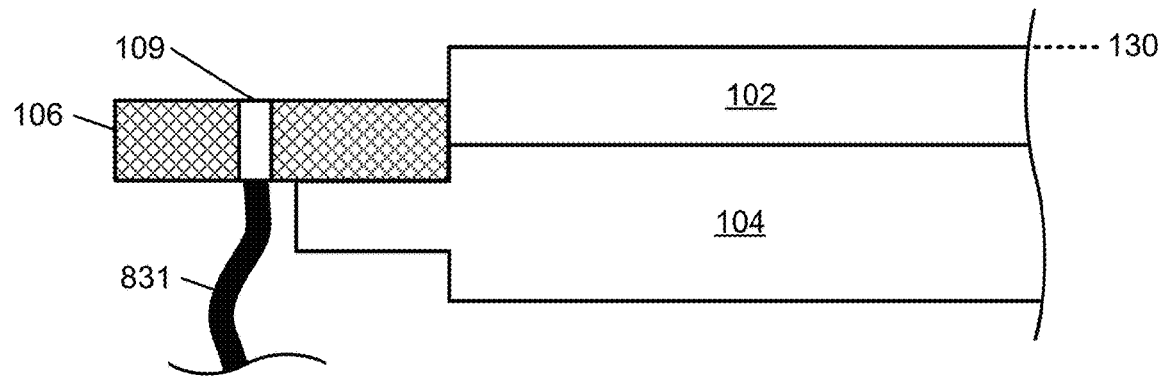
FIG. 8A illustrates an example embodiment of a gas-flow channel on an applique.

FIG. 8A illustrates an example embodiment of a gas-flow channel 109 on an applique 106. The applique 106 is shown in a cutaway view. In this embodiment, the gas-flow channel 109 is a hole or other opening that extends through the applique 106. The gas-flow channel 109 receives a gas flow from a gas-supply hose 831 and channels the received gas flow through the applique 109. Also, the upper surface of the applique 106 is lower than the substrate surface 130.

Figure 8B:
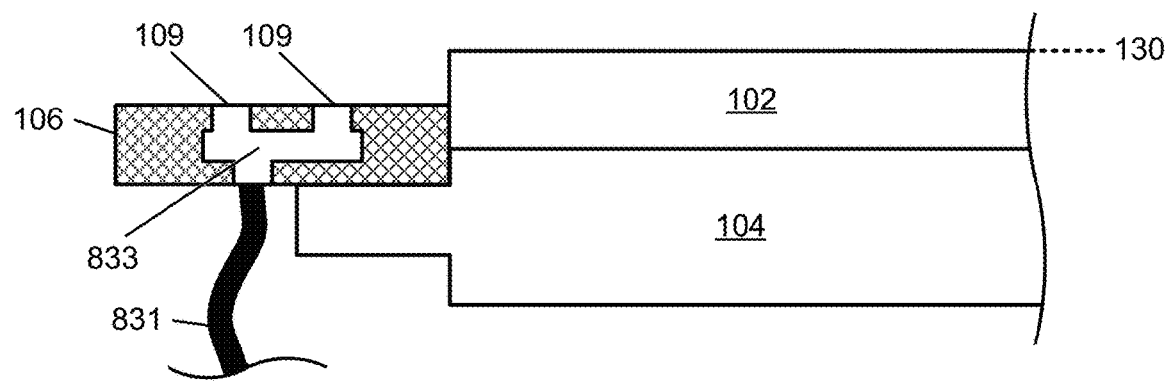
FIG. 8B illustrates an example embodiment of gas-flow channels on an applique.
Figure 8C:
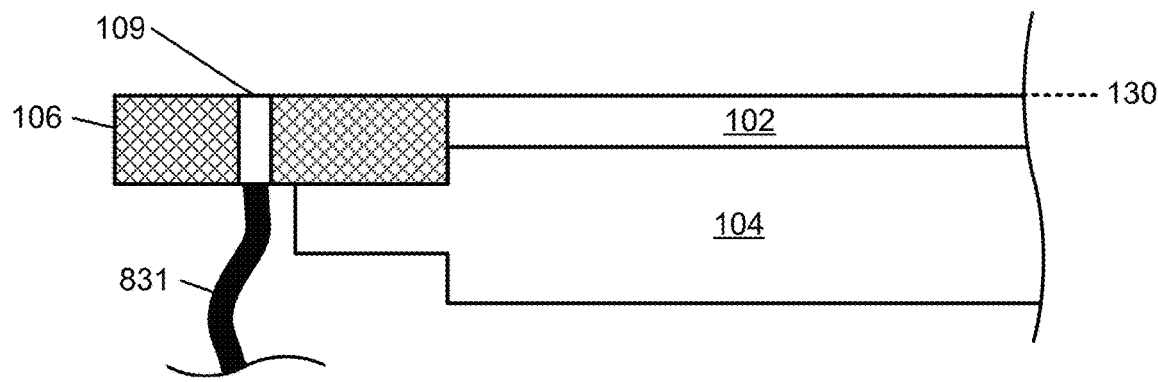
FIG. 8C illustrates an example embodiment of a gas-flow channel on an applique.

FIG. 8B illustrates an example embodiment of gas-flow channels 109 on an applique 106. The applique 106 is shown in a cutaway view. In this embodiment, the gas-flow channels 109 are holes or other openings that connect to a cavity 833 in the applique 106, which also connects to a gas-supply hose 831. The cavity 833 receives a gas flow from the gas-supply hose 831 and channels the received gas flow through the applique 109 to the gas-flow channels 109. Thus, the gas-flow channels 109 share the gas supply from the gas-supply hose 831. Also, the upper surface of the applique 106 is lower than the substrate surface 130.

FIG. 8C illustrates an example embodiment of a gas-flow channel 109 on an applique 106. This embodiment is similar to the embodiment in FIG. 8A. However, in this embodiment the upper surface of the applique 106 is coplanar with, or substantially coplanar with, the substrate surface 130.

Figure 9A:
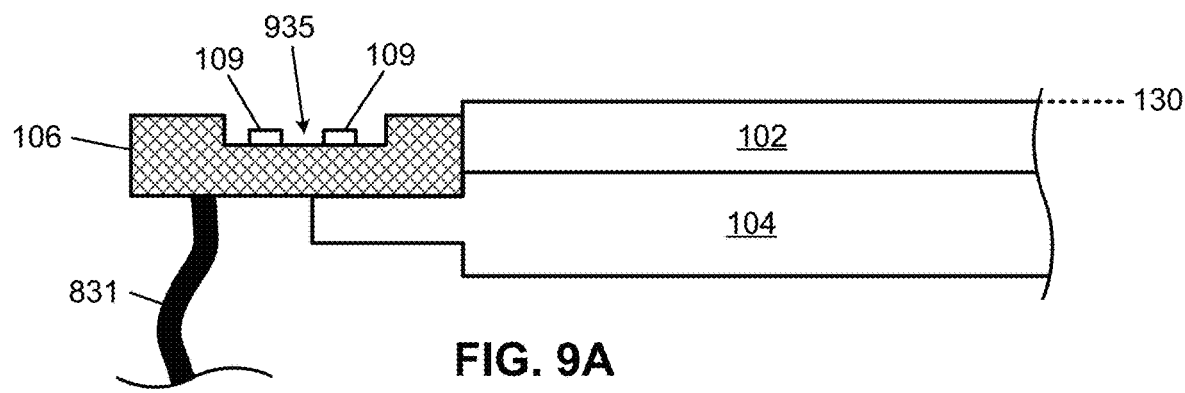
FIG. 9A illustrates an example embodiment of gas-flow channels on an applique.

FIG. 9A illustrates an example embodiment of gas-flow channels 109 on an applique 106. The applique 106 is shown in a cutaway view. In this embodiment, the gas-flow channels 109 are nozzles that are located in a recess 935 in the upper surface of the applique. The highest points of the gas-flow channels 109 are lower than the upper surface of the applique 106. Also, the upper surface of the applique 106 is lower than the substrate surface 130.

Figure 9B:
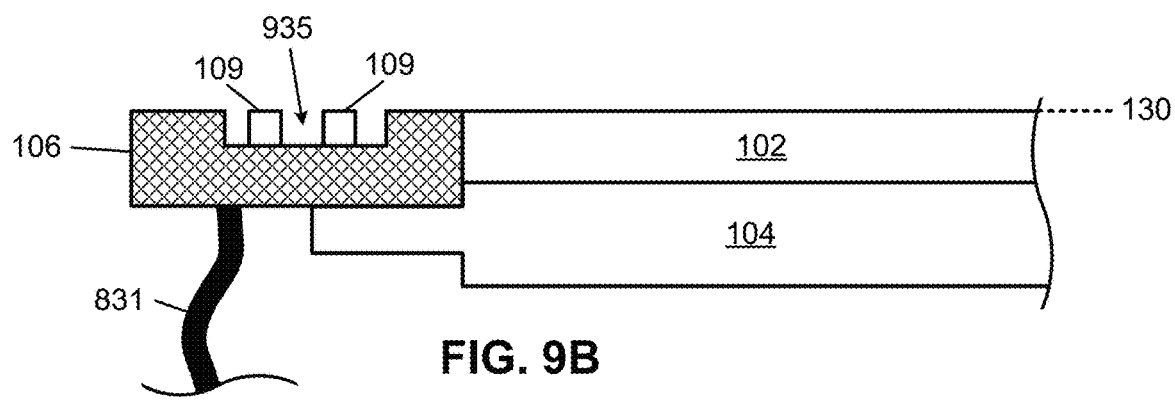
FIG. 9B illustrates an example embodiment of gas-flow channels on an applique.

FIG. 9B illustrates an example embodiment of gas-flow channels 109 on an applique 106. The applique 106 is shown in a cutaway view. In this embodiment, the gas-flow channels 109 are nozzles that are located in a recess 935 in the upper surface of the applique. However, in this embodiment, the highest points of the gas-flow channels 109 are level with, or substantially level with, the upper surface of the applique 106. Also, the upper surface of the applique 106 is coplanar with, or substantially coplanar with, the substrate surface 130.

Figure 9C:
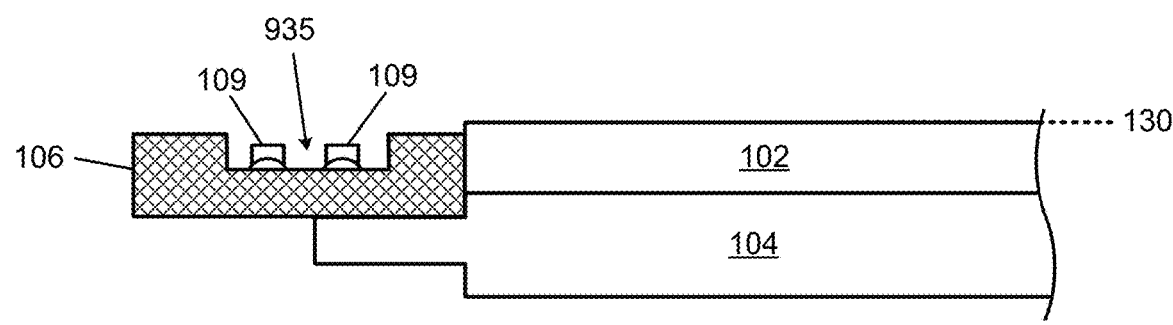
FIG. 9C illustrates an example embodiment of adjustable gas-flow channels on an applique.

FIG. 9C illustrates an example embodiment of adjustable gas-flow channels 109 on an applique 106. The applique 106 is shown in a cutaway view. In this embodiment, the adjustable gas-flow channels 109 are adjustable nozzles that are located in a recess 935 in the upper surface of the applique. The adjustable gas-flow channels 109 are positioned far enough from the walls of the recess 935 to allow the gas-flow channels 109 to adjust their gas-emission angles through a desired range without contacting the walls of the recess 935. The highest points of the gas-flow channels 109 are lower than the upper surface of the applique 106. Also, the upper surface of the applique 106 is lower than the substrate surface 130.

Figure 9D:
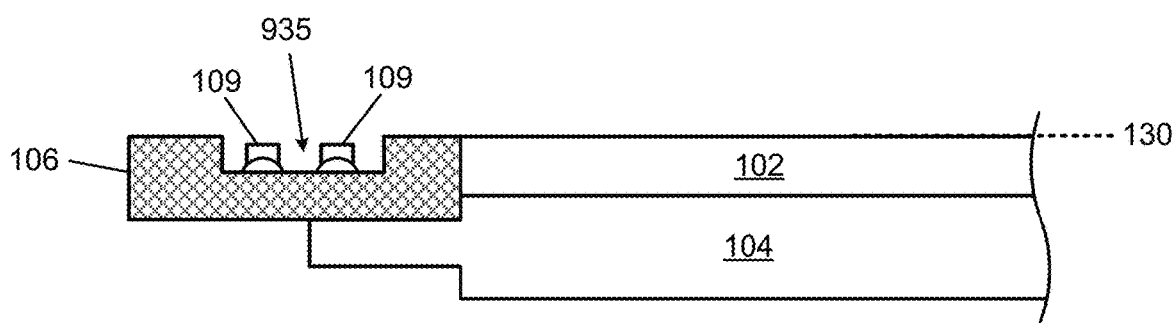
FIG. 9D illustrates an example embodiment of adjustable gas-flow channels on an applique.

FIG. 9D illustrates an example embodiment of adjustable gas-flow channels 109 on an applique 106. This embodiment is similar to the embodiment in FIG. 9C. However, in this embodiment the upper surface of the applique 106 is coplanar with, or substantially coplanar with, the substrate surface 130.

FIG. 10A illustrates an example embodiment of a gas-flow channel 109 directing a flow of gas 331 toward a sidewall 240 of a mesa 110. This embodiment also shows a border region 113 on the mesa 110. In this embodiment, none of the flow of gas 331 is directed toward anything other than the sidewall 240 of the mesa 110 or the border region 113. Also, this embodiment, as well as the embodiment in FIG. 10B, further illustrate that different embodiments may have different distances between the mesa 110, the substrate 102, and the gas-flow channels 109.

FIG. 10B illustrates an example embodiment of a gas-flow channel 109 directing a flow of gas 331 toward a sidewall 240 of a mesa 110. This embodiment also shows a border region 113 on the mesa 110. In this embodiment, the gas-emission angle of the gas-flow channel 109 has been adjusted such that none of the flow of gas 331 is directed toward anything other than the sidewall 240 of the mesa 110 or the border region 113.

Figure 11:
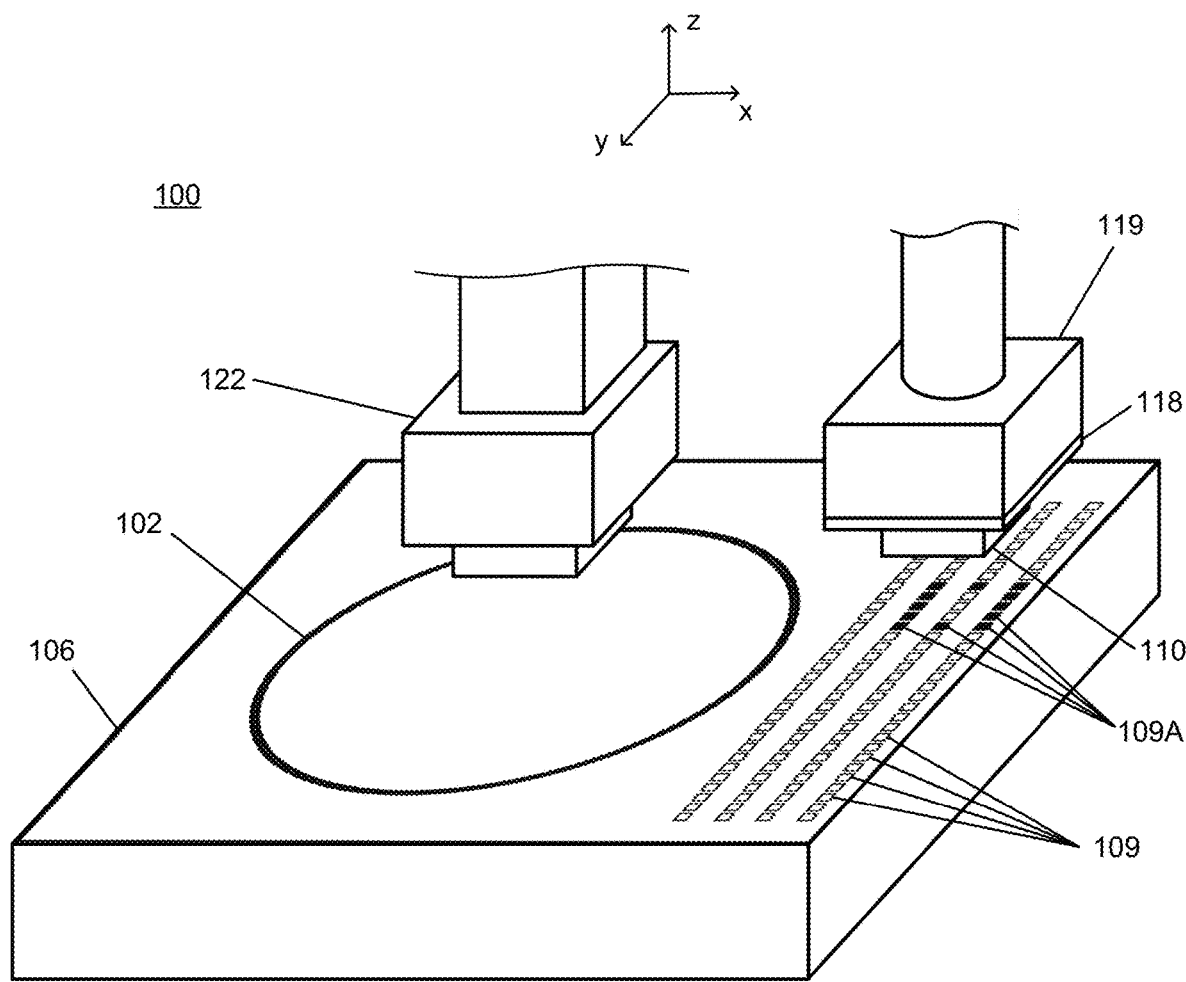
FIG. 11 illustrates a perspective view of an example embodiment of a nanoimprint lithography system.

FIG. 11 illustrates a perspective view of an example embodiment of a nanoimprint lithography system 100. This embodiment of a nanoimprint lithography system 100 includes a plurality of gas-flow channels 109, which are arranged in four rows. Based on the relative position of the mesa 110 to each of the gas-flow channels 109, the system 100 selects the gas-flow channels 109 (selected gas-flow channels are indicated by reference 109A and are shaded) that are in a position to direct their respective gas flows toward the sidewalls of the mesa 110 while the mesa 110 is in the position illustrated in FIG. 11 and activates the gas flows of the selected gas-flow channels 109. The system 100 may store calibration data that describes one or more of the following: The relative dimensions of the components of the system 100; a common coordinate system of the components; data that can be used to map the positions of the components to a common coordinate system; respective flow paths of each of the gas-flow channels 109; respective adjustable ranges of each of the gas-flow channels 109; and adjustable flow-path ranges of each of the adjustable gas-flow channels 109. Also, the system 100 may include position sensors that indicate the position of the mesa 110 relative to one or more of the following: the substrate 102, the substrate chuck 104, the applique 106, the substrate positioning stage 107, and the gas-flow channels 109. Additionally, the system 100 may store movement data that indicates a movement path (e.g., movement speed, movement direction) of the mesa 110 relative to the substrate 102. The system 100 can identify and select gas-flow channels 109 based on one or more of the following: calibration data, data from the position sensors, and the movement data.

Furthermore, some embodiments of the system 100 that include adjustable gas-flow channels 109 adjust the respective gas-emission angles of one or more of the gas-flow channels 109 based on one or more of the following: the calibration data, data from the position sensors, and the movement data.

Additionally, some embodiments of the system 100 identify the gas-flow channels 109 that are not to be activated, for example the gas-flow channels 109 that are positioned to direct a gas flow toward the pattern area (e.g., as shown in FIG. 2) of the mesa 110, and then activate all of the other gas-flow channels 109.

Figure 12:
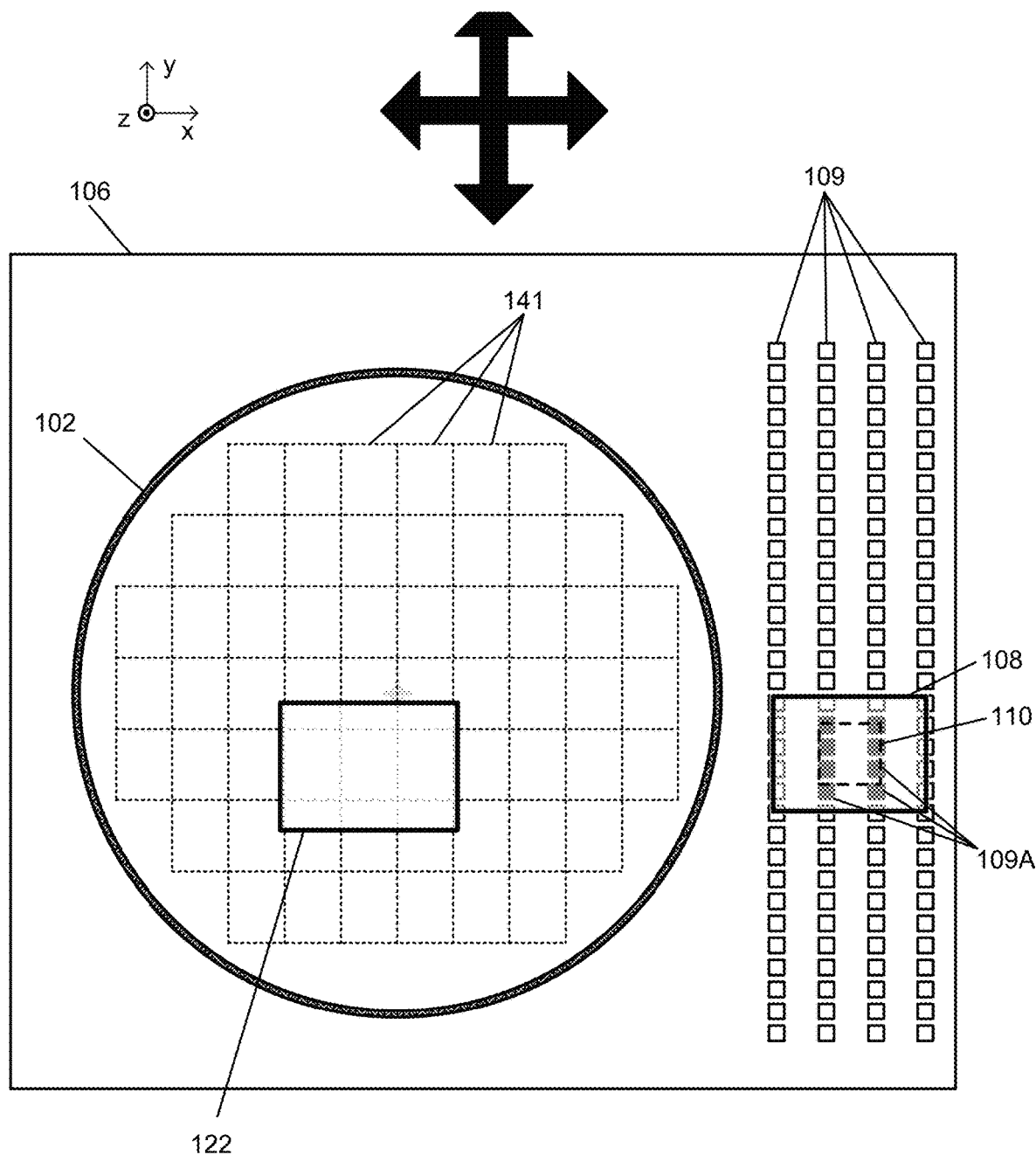
FIG. 12 illustrates a plan view (a view from along the z axis) of an example embodiment of a substrate, an applique, a fluid dispenser, and a template.

FIG. 12 illustrates a plan view (a view from along the z axis) of an example embodiment of a substrate 102, an applique 106, a fluid dispenser 122, and a template 108. The template 108 includes a mesa 110. The applique 106 includes a plurality of gas-flow channels 109. The substrate 102 includes a plurality of imprint fields 141. On each of the imprint fields 141, a respective pattern may be formed from formable material (e.g., a patterned layer). The substrate positioning stage that supports the applique 106 and the substrate 102 can move the applique 106 and the substrate 102 along both the x axis and the y axis. This allows the substrate positioning stage to position each of the imprint fields 141 under the fluid dispenser 122, which deposits formable material on the imprint field 141, and then under the template 108, which forms a pattern (e.g., a patterned layer) in the formable material that was deposited on the imprint field 141.

Based on the position of the template 108 relative to the positions of the gas-flow channels 109, the system 100 identifies and selects the gas-flow channels 109 that are positioned to direct a flow of gas onto the mesa 110, particularly the sidewalls of the mesa 110. The system then causes the selected gas-flow channels (which are shaded, and some of which are identified by reference 109A) to emit their respective flows of gas. In the embodiment shown in FIG. 12, all of the gas-flow channels 109 that are positioned to direct a gas flow at any part of the mesa 110 are selected.

Figure 13:
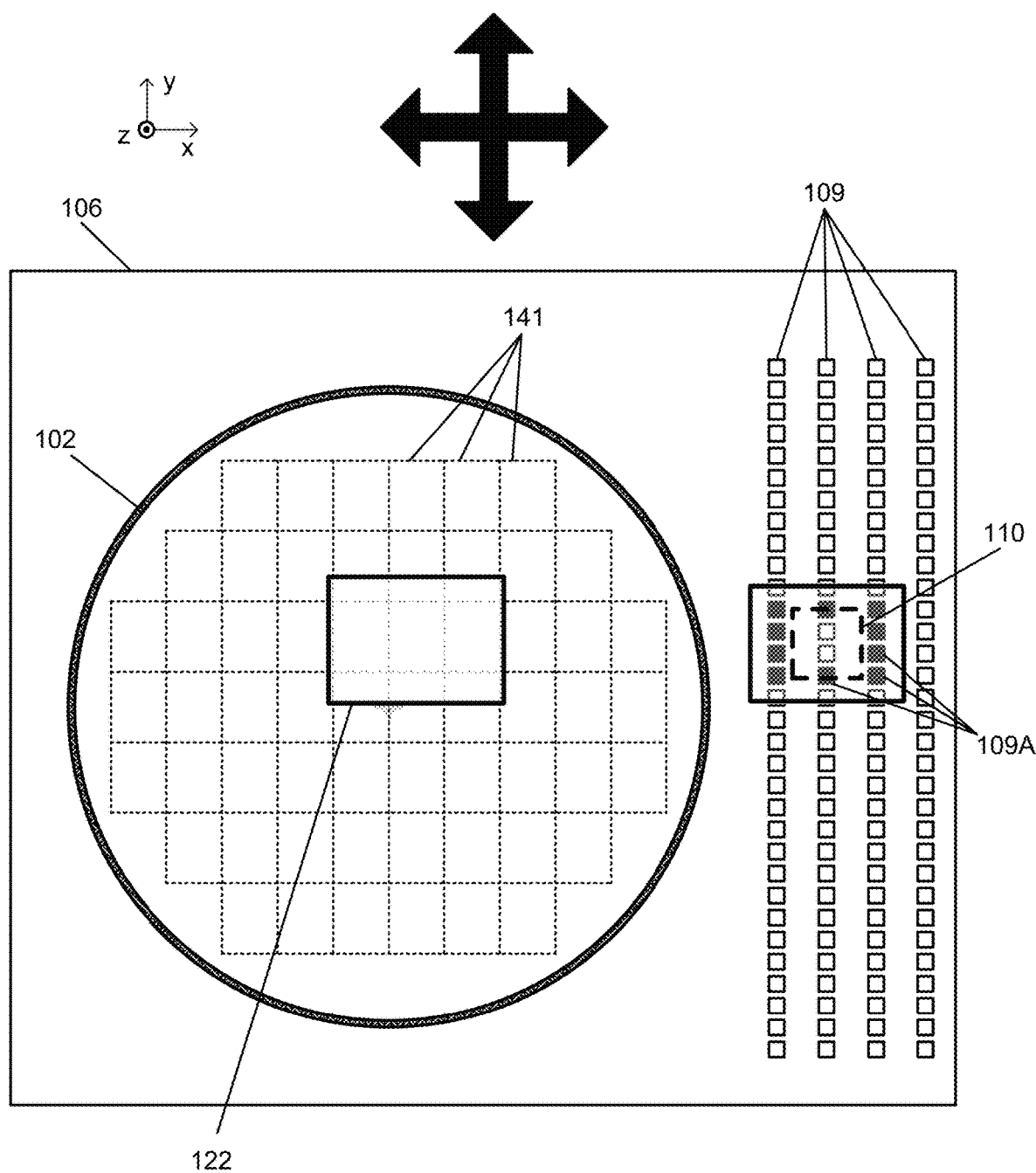
FIG. 13 illustrates a plan view (a view from along the z axis) of an example embodiment of a substrate, an applique, a fluid dispenser, and a template.

FIG. 13 illustrates a plan view (a view from along the z axis) of an example embodiment of a substrate 102, an applique 106, a fluid dispenser 122, and a template 108. The template 108 includes a mesa 110. The applique 106 includes a plurality of gas-flow channels 109. The substrate 102 includes a plurality of imprint fields 141. The substrate positioning stage that supports the applique 106 and the substrate 102 can move the applique 106 and the substrate 102 along both the x axis and the y axis.

Based on the position of the template 108 relative to the positions of the gas-flow channels 109, the system identifies and selects the gas-flow channels 109 that are in position to direct a flow of gas toward the mesa 110, particularly the sidewalls of the mesa 110. The system then causes the selected gas-flow channels (which are shaded, and some of which are identified by reference 109A) to emit their respective flows of gas. In contrast to the embodiment shown in FIG. 12, the embodiment in FIG. 13 selects the gas-flow channels 109 that are positioned to direct a gas flow at the mesa 110 except for the gas-flow channels 109 that are positioned to direct a gas flow at a patterning area of the mesa 110.

Figure 14:
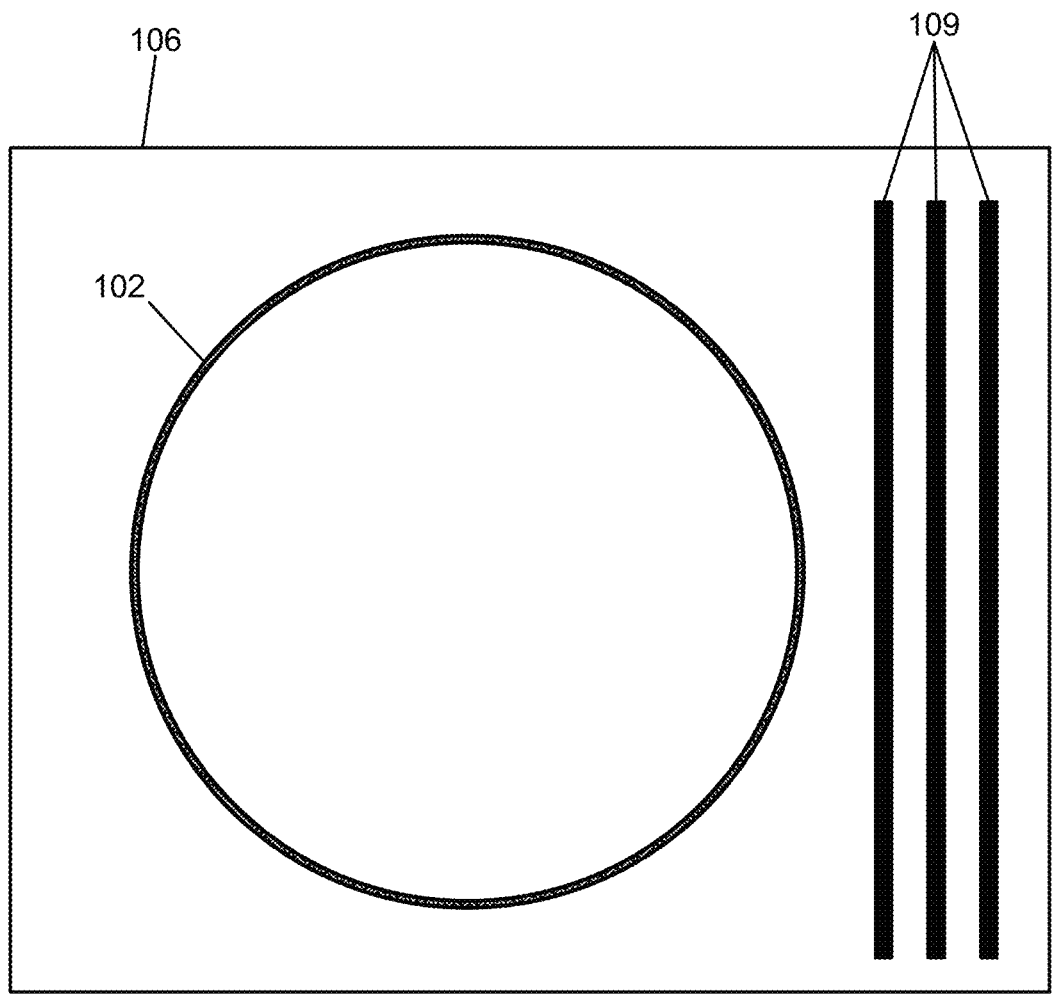
FIG. 14 illustrates a plan view (a view from along the z axis) of an example embodiment of a substrate and an applique.

The gas-flow channels 109 may have cross-sections shapes that are different from the cross-sectional shapes shown in FIGS. 11-13. For example, FIG. 14 illustrates a plan view of an example embodiment of a substrate 102 and an applique 106. The applique 106 includes a plurality of gas-flow channels 109. In this embodiment, the gas-flow channels 109 are elongated vents.

Figure 15:
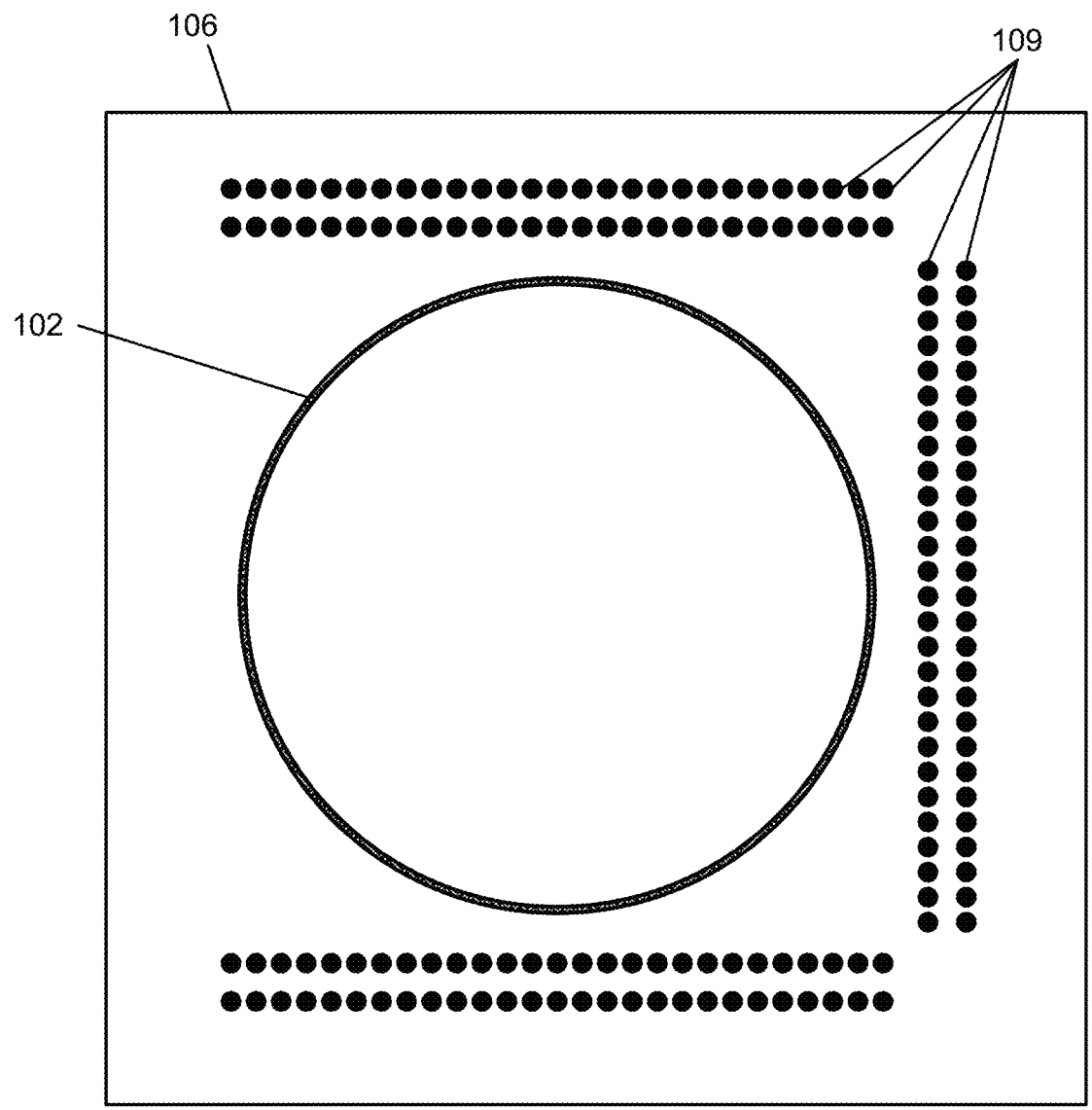
FIG. 15 illustrates a plan view (a view from along the z axis) of an example embodiment of a substrate and an applique.

Also, the gas-flow channels 109 may be located on more than one side of the substrate 102. For example, FIG. 15 illustrates a plan view of an example embodiment of a substrate 102 and an applique 106. The applique 106 includes a plurality of gas-flow channels 109. In this embodiment, the gas-flow channels 109 are located on three sides of the substrate 102.

Figure 16:
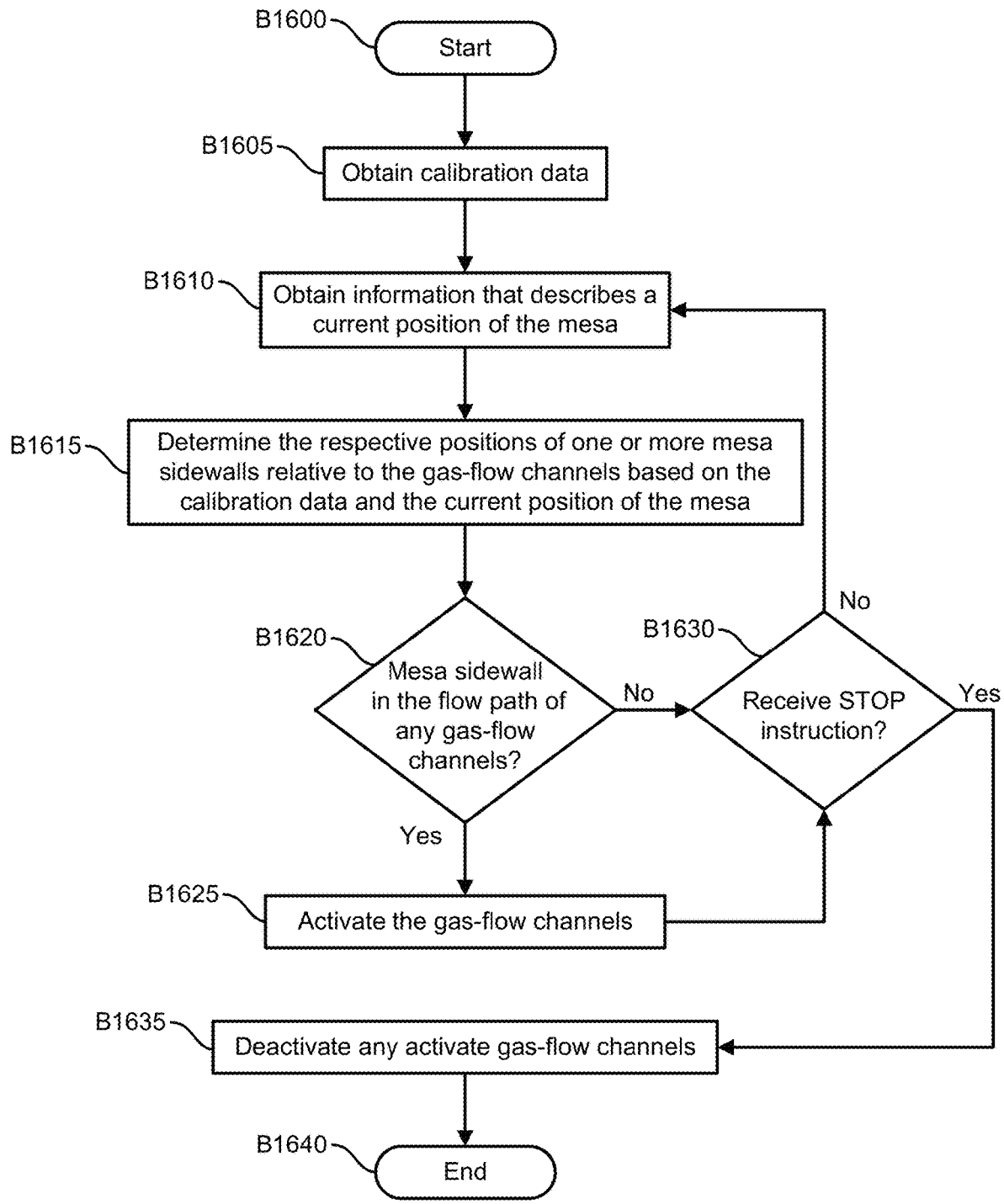
FIG. 16 illustrates an example embodiment of an operational flow for directing gas toward one or more mesa sidewalls.

FIG. 16 illustrates an example embodiment of an operational flow for directing gas toward one or more mesa sidewalls. Although this operational flow and the other operational flows that are described herein are each presented in a certain respective order, some embodiments of these operational flows perform at least some of the operations in different orders than the presented orders. Examples of different orders include concurrent, parallel, overlapping, reordered, simultaneous, incremental, and interleaved orders. Also, some embodiments of these operational flows include operations (e.g., blocks) from more than one of the operational flows that are described herein. Thus, some embodiments of the operational flows may omit blocks, add blocks (e.g., include blocks from other operational flows that are described herein), change the order of the blocks, combine blocks, or divide blocks into more blocks relative to the example embodiments of the operational flows that are described herein.

Furthermore, although this operational flow and the other operational flows that are described herein are performed by a nanoimprint-lithography-control device, some embodiments of these operational flows are performed by two or more nanoimprint-lithography-control devices or by one or more other specially-configured computing devices.

In FIG. 16, the flow starts in block B1600 and then proceeds to block B1605, where the nanoimprint-lithography-control device obtains calibration data. Next, in block B1610, the nanoimprint-lithography-control device obtains information that describes a current position of the mesa, for example from one or more position sensors.

Then, in block B1615, the nanoimprint-lithography-control device determines the respective positions of one or more mesa sidewalls relative to the gas-flow channels based on the calibration data and the current position of the mesa.

The flow then moves to block B1620, where the nanoimprint-lithography-control device determines whether any mesa sidewalls are positioned in the respective flow path (e.g., gas-flow range) of any of the gas-flow channels. If the nanoimprint-lithography-control device determines that one or more mesa sidewalls are positioned in the respective flow path of some of the gas-flow channels (B1620=Yes), then the flow moves to block B1625. Otherwise (block B1620=No), the flow moves to block B1630.

In block B1625, the nanoimprint-lithography-control device activates the gas-flow channels. The nanoimprint-lithography-control device may activate all of the gas-flow channels, or the nanoimprint-lithography-control device may activate only the gas-flow channels that have a mesa sidewall in their flow path. The flow then moves to block B1630.

In block B1630, the nanoimprint-lithography-control device determines whether it has received a STOP instruction (e.g., from a user input, from a program running on the nanoimprint-lithography-control device). If no STOP instruction has been received (B1630=No), the flow returns to block B1610. If a STOP instruction has been received (B1630=Yes), then flow moves to block B1635.

In block B1635, the nanoimprint-lithography-control device deactivates any active gas-flow channels, and then the flow ends in block B1640.

Figure 17:
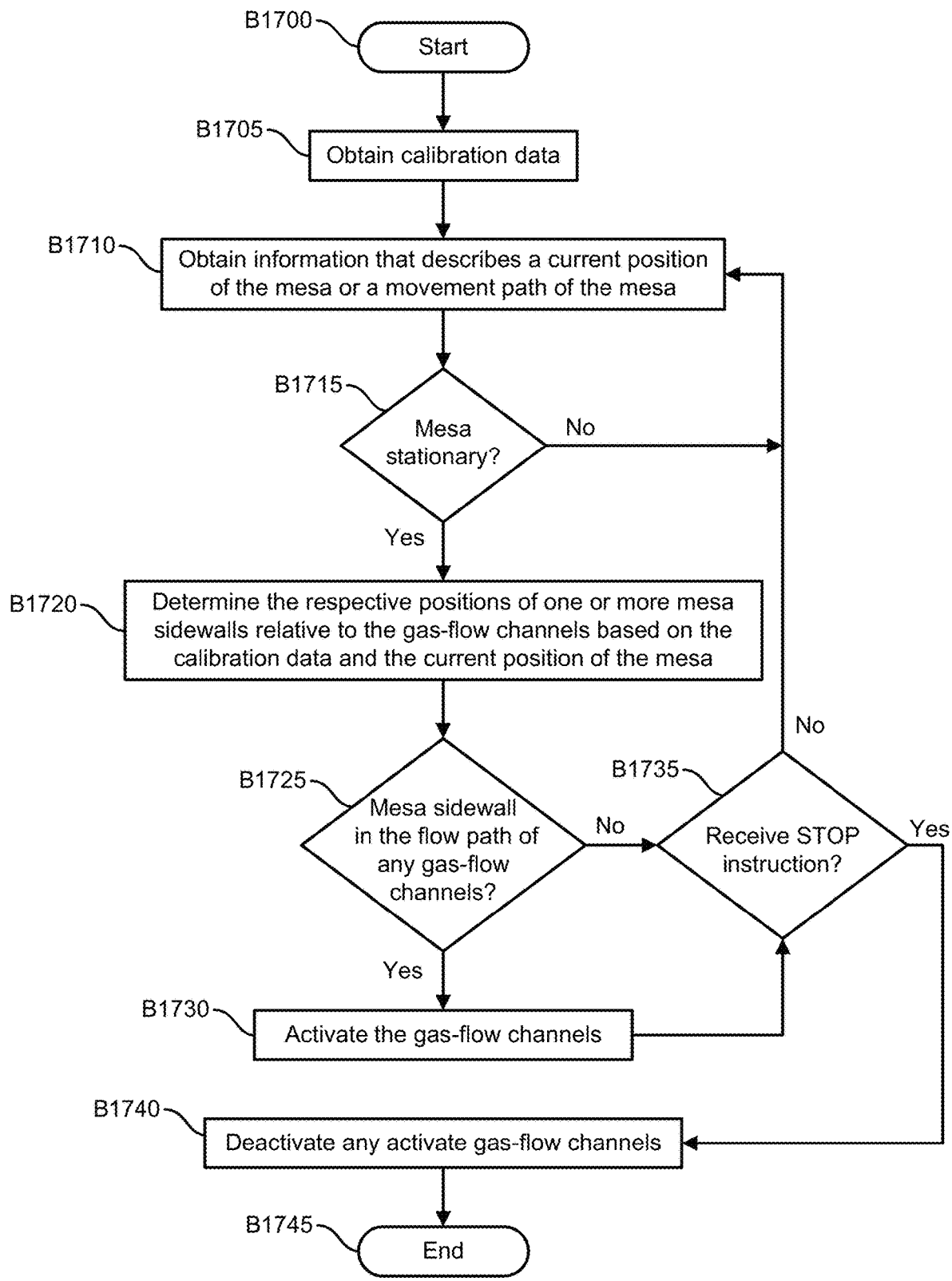
FIG. 17 illustrates an example embodiment of an operational flow for directing gas toward one or more mesa sidewalls.

FIG. 17 illustrates an example embodiment of an operational flow for directing gas toward one or more mesa sidewalls. The flow starts in block B1700 and then proceeds to block B1705, where the nanoimprint-lithography-control device obtains calibration data.

Next, in block B1710, the nanoimprint-lithography-control device obtains information that describes a current position of the mesa or a movement path of the mesa, for example from one or more position sensors or from a program that controls the movement of the mesa.

Then, in block B1715, the nanoimprint-lithography-control device determines if the mesa is stationary relative to the gas-flow channels. If the nanoimprint-lithography-control device determines that the mesa is not stationary relative to the gas-flow channels (B1715=No), then the flow returns to block B1710. Otherwise (B1715=Yes) the flow moves to block B1720.

In block B1720, the nanoimprint-lithography-control device determines the respective positions of one or more mesa sidewalls relative to the gas-flow channels based on the calibration data and the current position of the mesa.

Next, in block B1725, the nanoimprint-lithography-control device determines whether any mesa sidewalls are positioned in the respective flow path (e.g., gas-flow range) of any of the gas-flow channels. If the nanoimprint-lithography-control device determines that one or more mesa sidewalls are positioned in the respective flow path of one or more of the gas-flow channels (B1725=Yes), then the flow moves to block B1730. Otherwise (block B1725=No), the flow moves to block B1735.

In block B1730, the nanoimprint-lithography-control device activates the gas-flow channels. For example, the nanoimprint-lithography-control device may activate all of the gas-flow channels, and the nanoimprint-lithography-control device may activate only the one or more gas-flow channels that have a mesa sidewall in their flow path. The flow then moves to block B1735.

In block B1735, the nanoimprint-lithography-control device determines whether it has received a STOP instruction. If no STOP instruction has been received (B1735=No), the flow returns to block B1710. If a STOP instruction has been received (B1735=Yes), then flow moves to block B1740.

In block B1740, the nanoimprint-lithography-control device deactivates any active gas-flow channels, and then the flow ends in block B1745.

Accordingly, in the embodiment shown in FIG. 17, the nanoimprint-lithography-control device activates gas-flow channels only if the mesa is stationary relative to the gas-flow channels.

Figure 18:
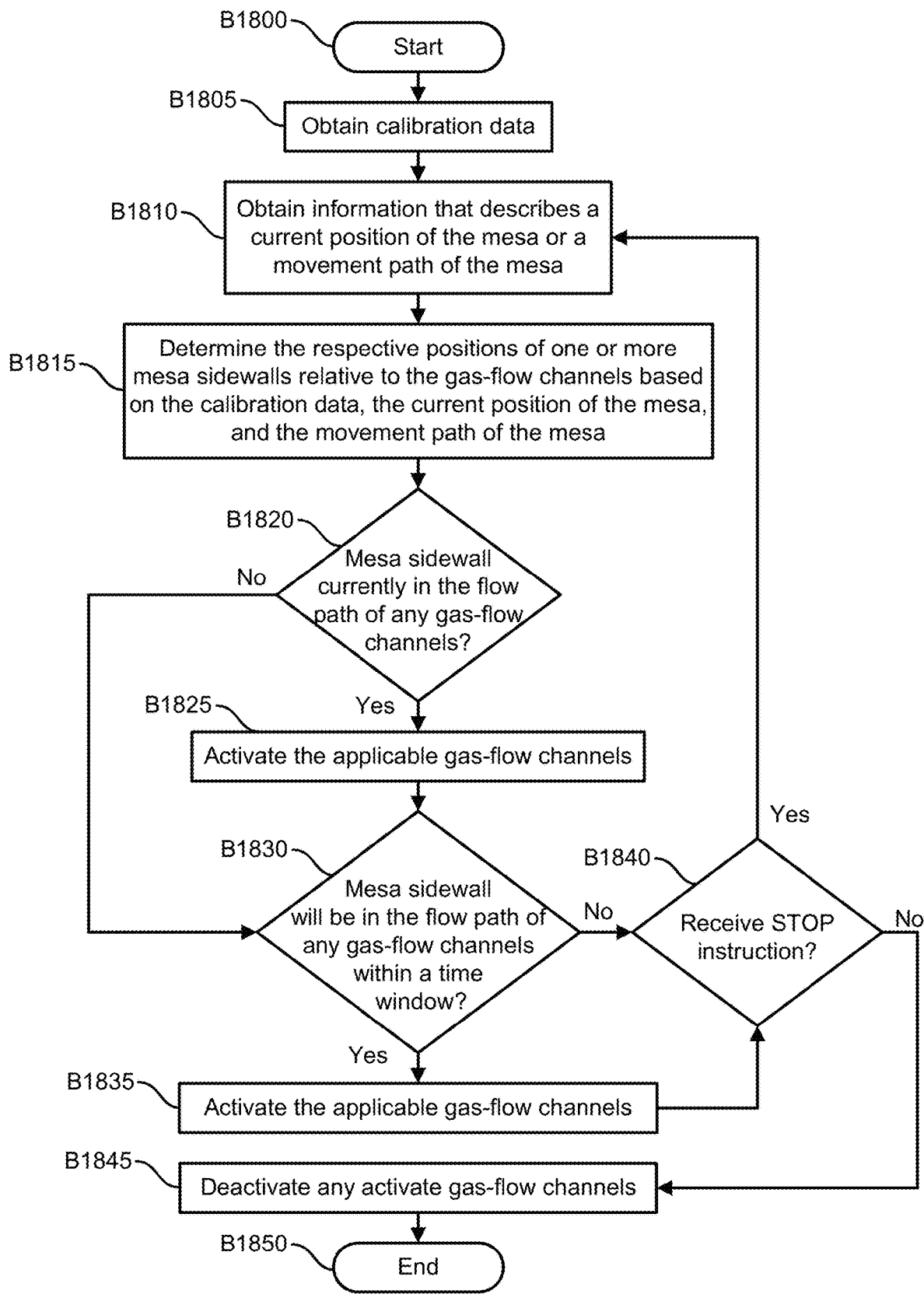
FIG. 18 illustrates an example embodiment of an operational flow for directing gas toward one or more mesa sidewalls.

FIG. 18 illustrates an example embodiment of an operational flow for directing gas toward one or more mesa sidewalls. The flow starts in block B1800 and then proceeds to block B1805, where the nanoimprint-lithography-control device obtains calibration data.

Next, in block B1810, the nanoimprint-lithography-control device obtains information that describes a current position of the mesa or a movement path of the mesa, for example from one or more position sensors or from a program that controls the movement of the mesa.

The flow then proceeds to block B1815, where the nanoimprint-lithography-control device determines the respective positions of one or more mesa sidewalls relative to the gas-flow channels based on the calibration data, the current position of the mesa, and the movement path of the mesa.

Next, in block B1820, the nanoimprint-lithography-control device determines whether any mesa sidewalls are currently positioned in the respective flow path (e.g., gas-flow range) of any of the gas-flow channels. If the nanoimprint-lithography-control device determines that one or more mesa sidewalls are currently positioned in the respective flow path of one or more of the gas-flow channels (B1820=Yes), then the flow moves to block B1825. Otherwise (block B1820=No), the flow moves to block B1830.

In block B1825, the nanoimprint-lithography-control device activates the applicable gas-flow channels (the one or more gas-flow channels that have a mesa sidewall in their flow path). The flow then moves to block B1830.

In block B1830, the nanoimprint-lithography-control device determines whether any mesa sidewall will be in the respective flow path of any gas-flow channels within a time window (e.g., 0.1 seconds, 0.05 seconds). If the nanoimprint-lithography-control device determines that one or more mesa sidewalls will be positioned in the respective flow path of some of the gas-flow channels within the time window (B1830=Yes), then the flow moves to block B1835. Otherwise (block B1830=No), the flow moves to block B1840.

In block B1835, the nanoimprint-lithography-control device activates the applicable gas-flow channels (the gas-flow channels that will have a mesa sidewall in their flow path within the time window). The flow then moves to block B1840.

In block B1840, the nanoimprint-lithography-control device determines whether it has received a STOP instruction. If no STOP instruction has been received (B1840=No), the flow returns to block B1810. If a STOP instruction has been received (B1840=Yes), then flow moves to block B1845.

In block B1845, the nanoimprint-lithography-control device deactivates any active gas-flow channels, and then the flow ends in block B1850.

Figure 19:
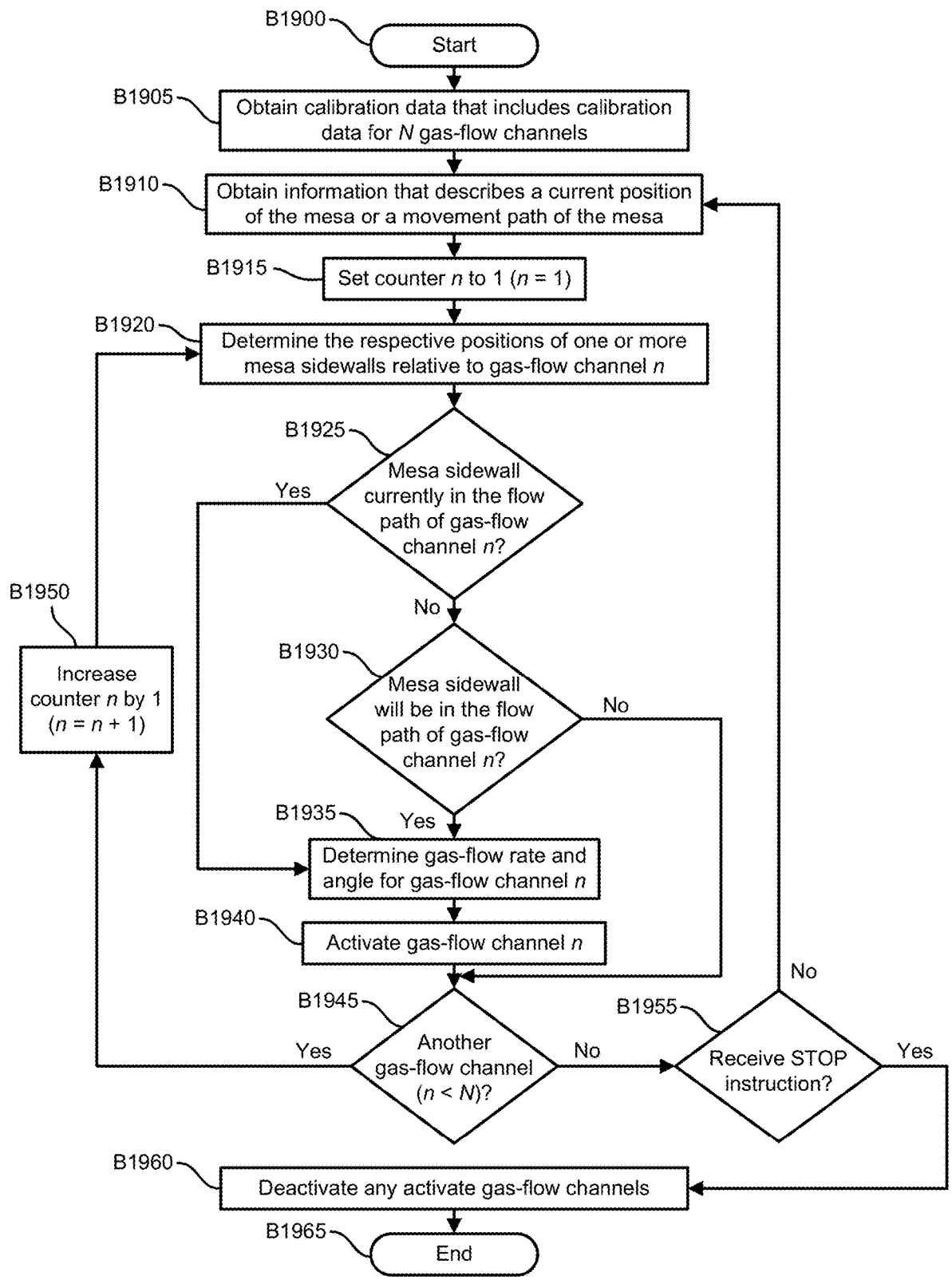
FIG. 19 illustrates an example embodiment of an operational flow for directing gas toward one or more mesa sidewalls.

FIG. 19 illustrates an example embodiment of an operational flow for directing gas toward one or more mesa sidewalls. The flow starts in block B1900 and then proceeds to block B1905, where the nanoimprint-lithography-control device obtains calibration data that includes calibration data for N gas-flow channels (where N is a positive integer).

Next, in block B1910, the nanoimprint-lithography-control device obtains information that describes a current position of the mesa or a movement path of the mesa, for example from one or more position sensors or from a program that controls the movement of the mesa.

The flow then moves to block B1915, where the nanoimprint-lithography-control device sets a counter n to 1.

The flow then proceeds to block B1920, where the nanoimprint-lithography-control device determines the respective positions of one or more mesa sidewalls relative to gas-flow channel n based on the calibration data, the current position of the mesa, and the movement path of the mesa.

Then, in block B1925, the nanoimprint-lithography-control device determines whether a mesa sidewall is currently in the flow path (e.g., gas-flow range) of gas-flow channel n. If the nanoimprint-lithography-control device determines that a mesa sidewall is currently in the flow path of gas-flow channel n (B1925=Yes), the flow proceeds to block B1935. Otherwise (B1925=No), the flow moves to block B1930, where the nanoimprint-lithography-control device determines whether a mesa sidewall will be in the flow path of gas-flow channel n within a time window. If the nanoimprint-lithography-control device determines that a mesa sidewall will be in the flow path of gas-flow channel n within the time window (B1930=Yes), the flow proceeds to block B1935. Otherwise (B1930=No), the flow moves to block B1940.

In block B1935, the nanoimprint-lithography-control device determines the gas-flow rate and the gas-emission angle for gas-flow channel n based at least on the positions of one or more mesa sidewalls relative to gas-flow channel n. Also, the nanoimprint-lithography-control device may determine the gas-flow rate and the gas-emission angle for gas-flow channel n further based on, for example, one or more of the following: the gas-flow rate of gas-flow channel n, the gas-flow range of gas-flow channel n, the temperature of the gas, the contents of the gas, the contents of the formable material, a moving speed of the mesa, a moving direction of the mesa, whether a dispenser is currently dispensing formable material onto the substrate, and whether a new substrate is currently being placed on a substrate chuck.

In block B1940, the nanoimprint-lithography-control device activates gas-flow channel n at the determined gas-flow rate and gas-emission angle. This may include adjusting a gas-emission angle of the gas-flow channel, for example by activating one or more motors or actuators. Accordingly, any activated gas-flow channels may have different gas-flow rates and different gas-emission angles. Also, the gas-emission angle and the flow rate (where the flow rate is greater than zero) of an active gas-flow channel can vary over time (e.g., over subsequent iterations of B1910-B1955), for example according to a movement or position of the mesa relative to the gas-flow channel. The flow then proceeds to block B1945.

In block B1945, the nanoimprint-lithography-control device determines whether there is another gas-flow channel, for example by determining whether n<N. If the nanoimprint-lithography-control device determines that there is another gas-flow channel (B1945=Yes), then the flow moves to block B1950, where the nanoimprint-lithography-control device increases the counter n by 1, and then returns to block B1920. If the nanoimprint-lithography-control device determines that there is not another gas-flow channel (B1945=No), then the flow moves to block B1955.

In block B1955, the nanoimprint-lithography-control device determines whether it has received a STOP instruction. If no STOP instruction has been received (B1955=No), the flow returns to block B1910. If a STOP instruction has been received (B1955=Yes), then flow moves to block B1960.

In block B1960, the nanoimprint-lithography-control device deactivates any active gas-flow channels, and then the flow ends in block B1965.

Figure 20:
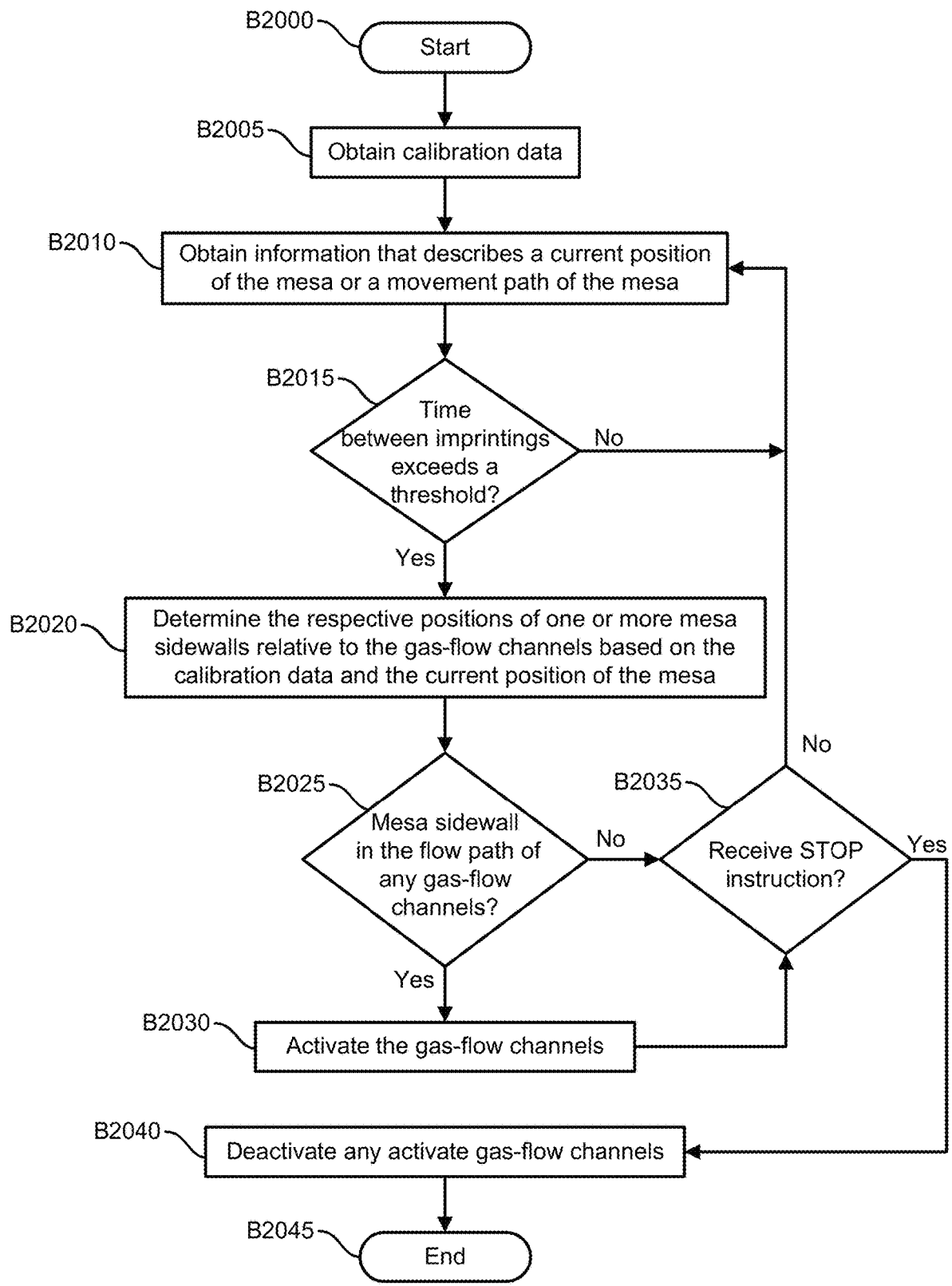
FIG. 20 illustrates an example embodiment of an operational flow for directing gas toward one or more mesa sidewalls.

FIG. 20 illustrates an example embodiment of an operational flow for directing gas toward one or more mesa sidewalls. The flow starts in block B2000 and then proceeds to block B2005, where the nanoimprint-lithography-control device obtains calibration data.

Next, in block B2010, the nanoimprint-lithography-control device obtains information that describes a current position of the mesa or a movement path of the mesa, for example from one or more position sensors or from a program that controls the movement of the mesa.

Then, in block B2015, the nanoimprint-lithography-control device determines if the time between consecutive imprintings exceeds a threshold (or, in some embodiments, if the time until the next imprinting exceeds a threshold). If the nanoimprint-lithography-control device determines that the time between consecutive imprintings does exceed a threshold (B2015=Yes), then the flow moves to block B2020. Otherwise (B2015=No) the flow returns to block B2010.

In block B2020, the nanoimprint-lithography-control device determines the respective positions of one or more mesa sidewalls relative to the gas-flow channels based on the calibration data and the current position of the mesa.

Next, in block B2025, the nanoimprint-lithography-control device determines whether any mesa sidewalls are positioned in the respective flow path (e.g., gas-flow range) of any of the gas-flow channels. If the nanoimprint-lithography-control device determines that one or more mesa sidewalls are positioned in the respective flow path of one or more of the gas-flow channels (B2025=Yes), then the flow moves to block B2030. Otherwise (block B2025=No), the flow moves to block B2035.

In block B2030, the nanoimprint-lithography-control device activates the gas-flow channels. For example, the nanoimprint-lithography-control device may activate all of the gas-flow channels, or the nanoimprint-lithography-control device may activate only the one or more gas-flow channels that have a mesa sidewall in their respective flow path. Additionally, the nanoimprint-lithography-control device may select the gas-flow rates of the activated gas-flow channels based on the length of time between imprintings. For example, the gas-flow rates may be higher when the time between imprintings is shorter. The flow then moves to block B2035.

In block B2035, the nanoimprint-lithography-control device determines whether it has received a STOP instruction. If no STOP instruction has been received (B2035=No), the flow returns to block B2010. If a STOP instruction has been received (B2035=Yes), then flow moves to block B2040.

In block B2040, the nanoimprint-lithography-control device deactivates any active gas-flow channels, and then the flow ends in block B2045.

Thus, in some embodiments, the nanoimprint lithography system 100 determines the amount of time between imprintings (e.g., formations of a patterned layer) on the substrate 102 and activates the gas flows of the gas-flow channels 109 only if the time between consecutive imprintings exceeds a threshold or only if the time until the next imprinting exceeds a threshold.

Also, each of these operations flows may be modified if the gas-flow channels are adjustable. For example, they may be modified to determine if a mesa sidewall is within an adjustable range of a gas-flow channel's flow path; if a mesa sidewall is within an adjustable range of a gas-flow channel's flow path, determine the adjustment to make to the gas-flow channel to put the mesa sidewall in the flow path; and make the adjustment to the gas-flow channel.

The invention claimed is:

1. A method comprising:
   positioning a template for imprinting a formable material over one or more gas-flow channels on a stage, wherein the template includes a patterning surface, a mesa, and at least one mesa sidewall; and
   directing a gas flow through the one or more gas-flow channels toward a portion of the at least one mesa sidewall while the template is not in contact with the formable material that has been deposited on a substrate.

2. The method of claim 1, wherein during directing of the gas flow through the one or more gas-flow channels toward the at least one mesa sidewall, substantially none of the gas flow is directed toward the patterning surface of the template.

3. The method according to claim 1, wherein the stage holds a substrate, and
   wherein directing the gas flow through the one or more gas-flow channels toward the at least one mesa sidewall is performed while the formable material is being dispensed onto the substrate.

4. The method according to claim 1, wherein directing the gas flow through the one or more gas-flow channels toward the at least one mesa sidewall is performed only while the template is stationary relative to the stage.

5. The method according to claim 1, further comprising:
   prior to directing the gas flow through the one or more gas-flow channels, selecting the one or more gas-flow channels from a plurality of gas-flow channels based on a position of the stage relative to a position of the template.

6. The method according to claim 1, wherein directing the gas flow through the one or more gas-flow channels toward the at least one mesa sidewall is performed during substrate exchange.

7. The method according to claim 1, wherein directing the gas flow through the one or more gas-flow channels toward the at least one mesa sidewall is performed during a period of time between consecutive imprintings of the formable material by the template only if the period of time is greater than a threshold.

8. The method according to claim 1, wherein directing the gas flow through the one or more gas-flow channels toward the portion of the at least one mesa sidewall includes
   activating the gas flow through the one or more gas-flow channels when the template is in a first position,
   deactivating the gas flow through the one or more gas-flow channels when the template is in a second position that is different from the first position, and
   activating the gas flow through the one or more gas-flow channels when the template is in a third position that is different from the first position and from the second position,
as the template moves from the first position to the second position to the third position.

9. The method of claim 1, further comprising:
   manufacturing one or more articles, wherein manufacturing the one or more articles includes:
      making one or more imprints, using the patterning surface of the template, in the formable material on a substrate held in a substrate chuck on the stage; and
      processing the substrate on which the one or more imprints have been made so as to manufacture the one or more articles.

10. A device comprising:
    a template chuck configured to hold a template for imprinting a formable material, wherein the template includes a patterning surface, a mesa, and a mesa sidewall;
    a stage that is movable relative to the template, wherein the stage includes a substrate chuck and one or more gas-flow channels that are configured to direct a gas flow at the mesa sidewall;
    one or more memories; and
    one or more processors that are in communication with the one or more memories and that cooperate with the one or more memories to cause the device to direct the gas flow at the mesa sidewall while the template is not in contact with the formable material that has been deposited on a substrate that is held by the substrate chuck.

11. The device of claim 10, wherein the one or more gas-flow channels are positioned adjacent to the substrate chuck.

12. The device of claim 10, wherein the one or more gas-flow channels are configured to direct the gas flow away from the patterning surface while directing the gas flow at the mesa sidewall.

13. The device of claim 10, further comprising:
a formable-material dispenser that is configured to dispense the formable material onto the substrate that is held by the substrate chuck,
wherein the one or more processors further cooperate with the one or more memories to cause the device to
direct the gas flow at the mesa sidewall while the formable-material dispenser dispenses the formable material onto the substrate.

14. The device of claim 10, wherein the one or more processors further cooperate with the one or more memories to cause the device to
select the one or more gas-flow channels from a plurality of gas-flow channels based on a position of the stage relative to a position of the template.

15. The device of claim 14, wherein the one or more processors further cooperate with the one or more memories to cause the device to
direct the gas flow at the mesa sidewall through the one or more gas-flow channels while not flowing gas through other gas-flow channels of the plurality of gas-flow channels.

16. The device of claim 10, wherein the one or more processors further cooperate with the one or more memories to cause the device to
calculate a period of time between consecutive imprintings of the formable material by the template, and
direct the gas flow at the mesa sidewall through the one or more gas-flow channels during the period of time only if the period of time is greater than a threshold.

17. The device of claim 10, wherein the one or more gas-flow channels include two or more gas-flow channels,
wherein the stage is configured to move the substrate chuck along an axis, and
wherein the two or more gas-flow channels are arranged in a row that is orthogonal to the axis.

18. The device of claim 10, further comprising:
one or more actuators or one or more motors,
wherein respective gas-emission angles of the one or more gas-flow channels are configured to be adjusted by the one or more actuators or by the one or more motors.

19. The device of claim 10, wherein the one or more processors further cooperate with the one or more memories to cause the device to direct the gas flow at the mesa sidewall only while
a formable-material dispenser dispenses formable material onto the substrate that is held in the substrate chuck,
the stage is moving toward the formable-material dispenser, or
the stage is moving away from the formable-material dispenser,
wherein the formable-material dispenser is configured to dispense the formable material onto the substrate that is held in the substrate chuck.

20. A device comprising:
a template chuck configured to hold a template for imprinting a formable material, wherein the template includes a patterning surface, a mesa, and a mesa sidewall;
a stage that is movable relative to the template, wherein the stage includes a substrate chuck and one or more gas-flow channels;
a formable-material dispenser that is configured to dispense the formable material onto a substrate that is held by the substrate chuck;
one or more memories; and
one or more processors that are in communication with the one or more memories and that cooperate with the one or more memories to
cause the one or more gas-flow channels to direct a gas flow at the mesa sidewall while the formable-material dispenser is positioned over the substrate and dispenses the formable material onto the substrate.

21. A method comprising:
contacting a template with a formable material that has been deposited on a substrate, wherein the template includes a first surface that contacts the formable material, a second surface that does not contact the formable material, and at least one sidewall connecting the first surface and the second surface; and
directing a gas flow, through one or more gas-flow channels on a stage that holds the substrate, toward a portion of the at least one sidewall while the template is not in contact with the formable material that has been deposited on the substrate.

* * * * *